United States Patent
Van Dal

(10) Patent No.: US 12,249,656 B2
(45) Date of Patent: Mar. 11, 2025

(54) TRANSISTOR, INTEGRATED CIRCUIT, AND MANUFACTURING METHOD OF TRANSISTOR

(71) Applicant: Taiwan Semiconductor Manufacturing Company, Ltd., Hsinchu (TW)

(72) Inventor: Marcus Johannes Henricus Van Dal, Linden (BE)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/665,572

(22) Filed: May 16, 2024

(65) Prior Publication Data

US 2024/0304730 A1  Sep. 12, 2024

Related U.S. Application Data

(63) Continuation of application No. 18/165,936, filed on Feb. 8, 2023, now Pat. No. 12,021,154, which is a continuation of application No. 17/099,800, filed on Nov. 17, 2020, now Pat. No. 11,605,740.

(60) Provisional application No. 63/030,929, filed on May 28, 2020.

(51) Int. Cl.
| | |
|---|---|
| H01L 29/786 | (2006.01) |
| H01L 27/12 | (2006.01) |
| H01L 29/06 | (2006.01) |
| H01L 29/41 | (2006.01) |
| H01L 29/423 | (2006.01) |
| H01L 29/66 | (2006.01) |
| H01L 29/78 | (2006.01) |
| H10B 61/00 | (2023.01) |
| H10B 63/00 | (2023.01) |

(52) U.S. Cl.
CPC .... *H01L 29/78696* (2013.01); *H01L 27/1207* (2013.01); *H01L 29/0665* (2013.01); *H01L 29/413* (2013.01); *H01L 29/42392* (2013.01); *H01L 29/66969* (2013.01); *H01L 29/7853* (2013.01); *H10B 61/22* (2023.02); *H10B 63/30* (2023.02); *H01L 29/7869* (2013.01)

(58) Field of Classification Search
CPC .......... H01L 29/78696; H01L 27/1207; H01L 29/0665; H01L 29/413; H01L 29/42392; H01L 29/66969; H01L 29/7853; H01L 29/7869; H01L 29/0673; H01L 29/66439; H01L 29/66545; H01L 29/775; H01L 29/78; H01L 29/42356; H10B 61/22; H10B 63/30; B82Y 10/00
USPC ........................................................ 257/66
See application file for complete search history.

(56) References Cited

U.S. PATENT DOCUMENTS 12,021,154 B2 * 6/2024 Van Dal .............. H01L 29/7853

\* cited by examiner

*Primary Examiner* — Tong-Ho Kim
(74) *Attorney, Agent, or Firm* — JCIPRNET

(57) ABSTRACT

A transistor includes a first gate structure, a channel layer, and source/drain contacts. The first gate structure includes metallic nanosheets. Each of the metallic nanosheets includes a top surface, a bottom surface opposite to the top surface, and sidewalls connecting the top surface and the bottom surface. The channel layer surrounds the top surfaces, the bottom surfaces, and the sidewalls of the metallic nanosheets. The source/drain contacts are electrically connected to the channel layer. A portion of the channel layer is located between the source/drain contacts and the metallic nanosheets.

20 Claims, 19 Drawing Sheets

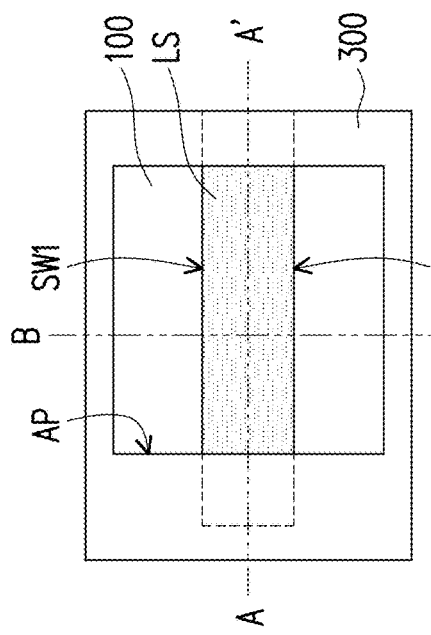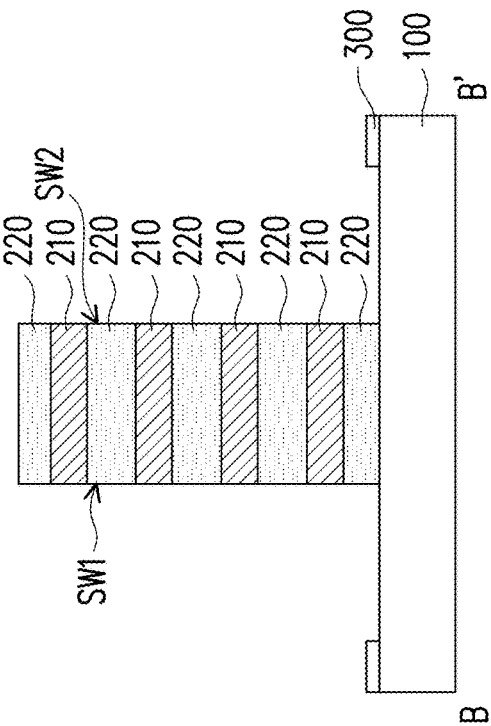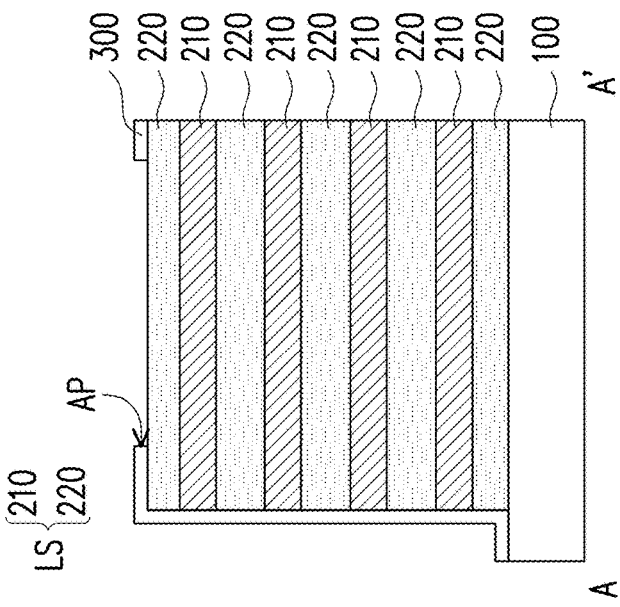

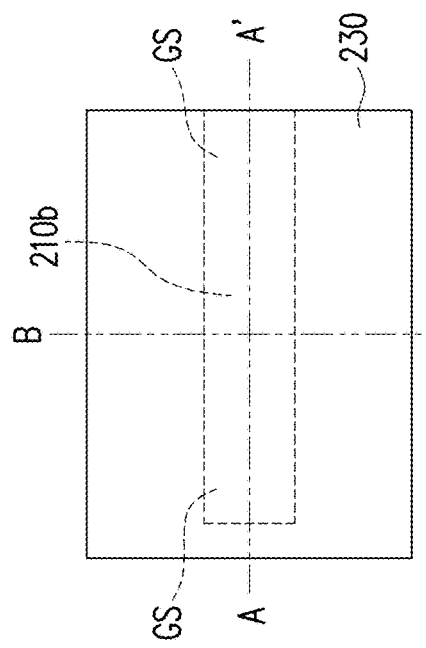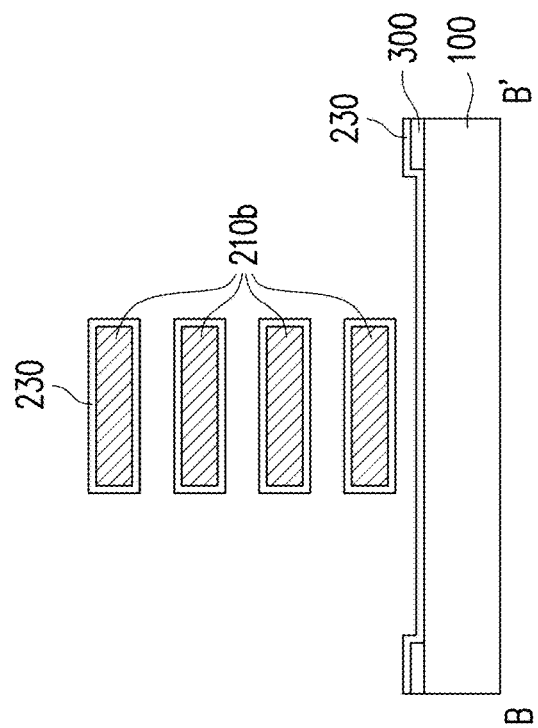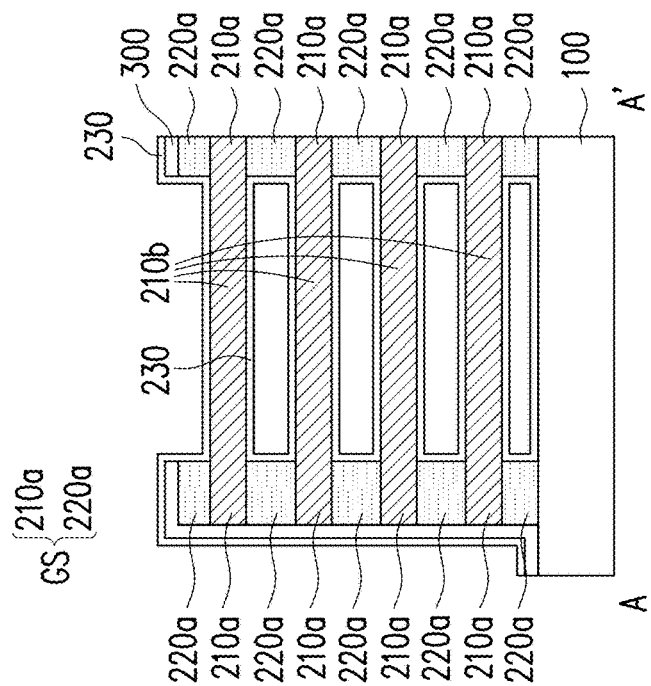

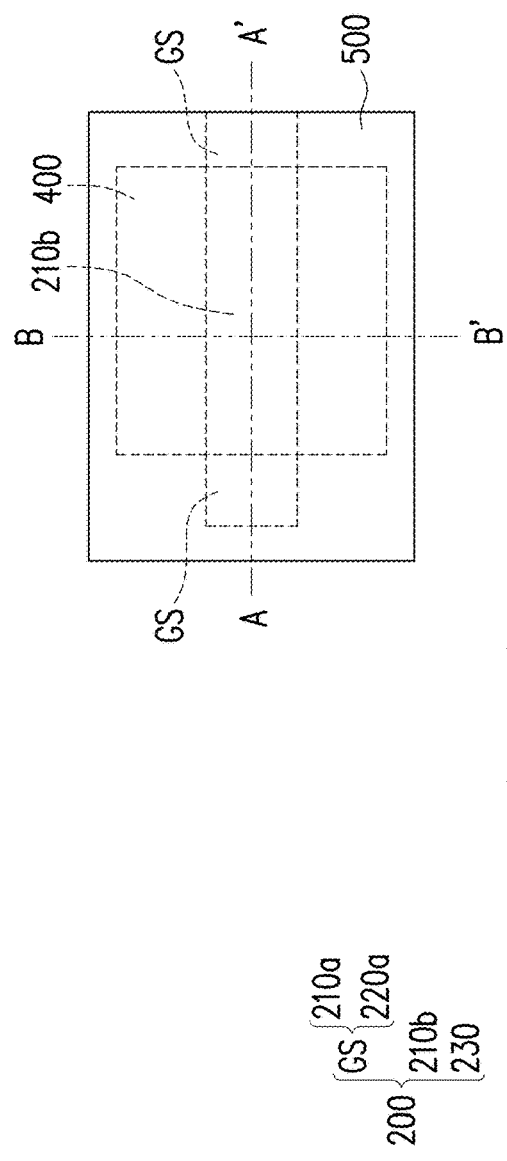
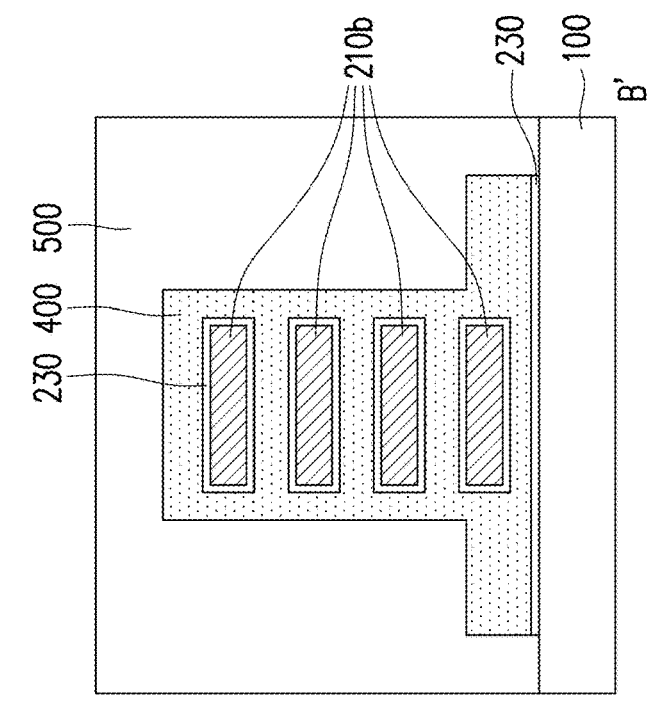
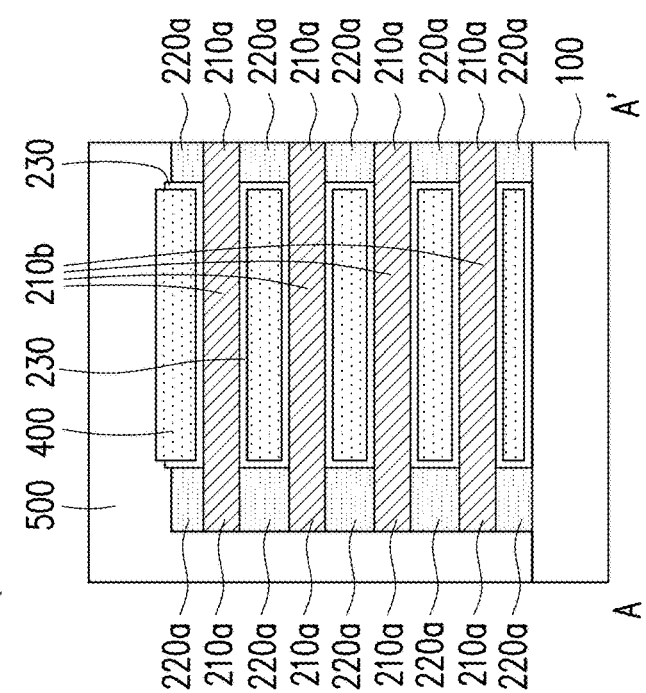
FIG. 2H
FIG. 4H
FIG. 3H

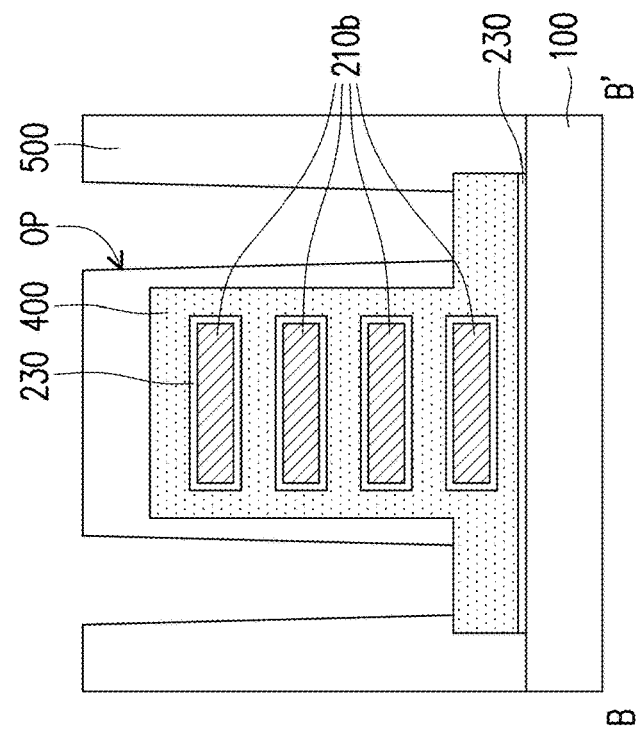
FIG. 2I
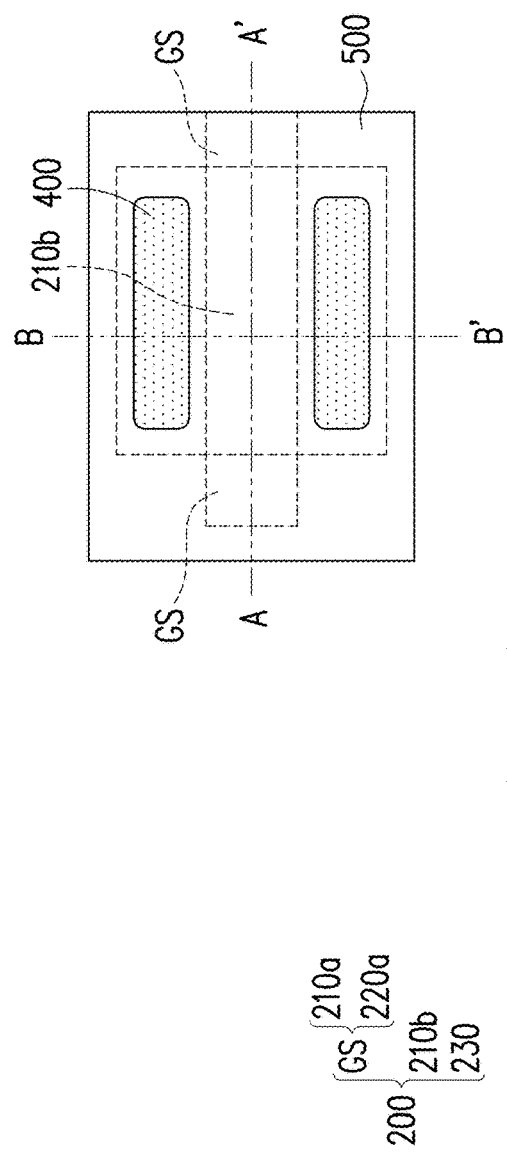
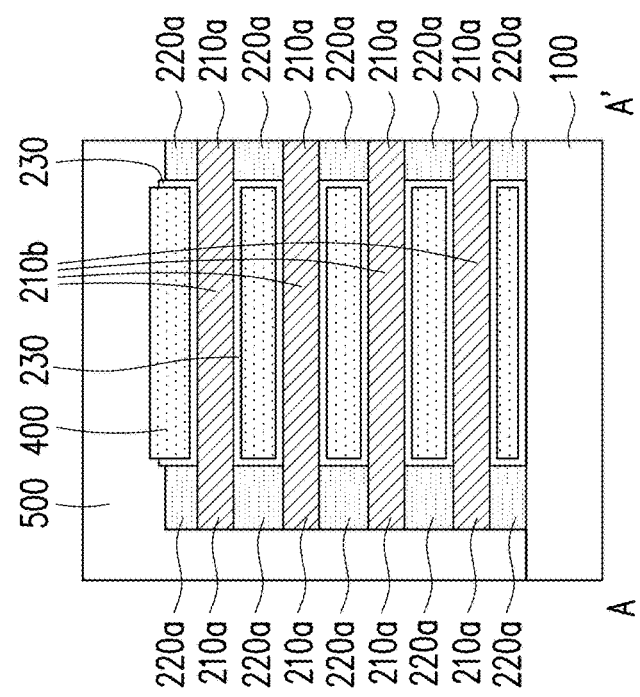
FIG. 3I
FIG. 4I

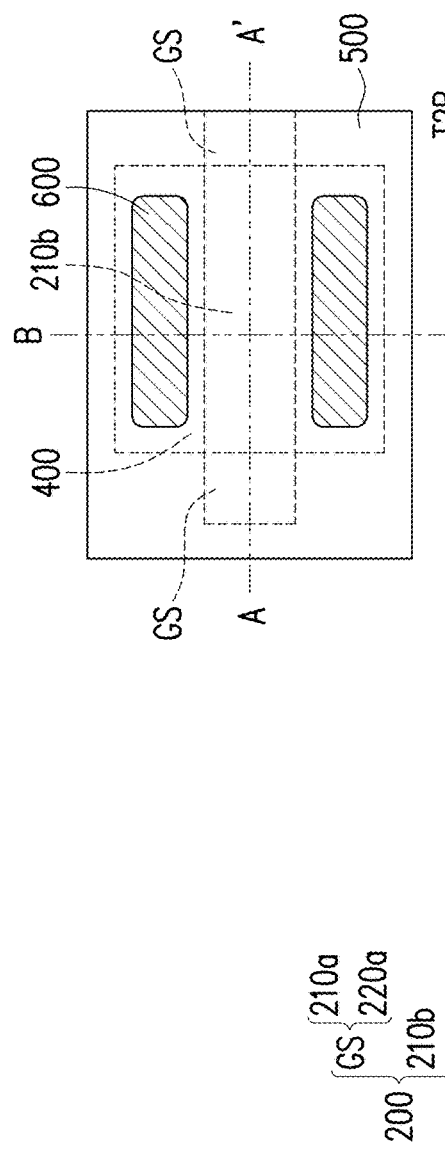
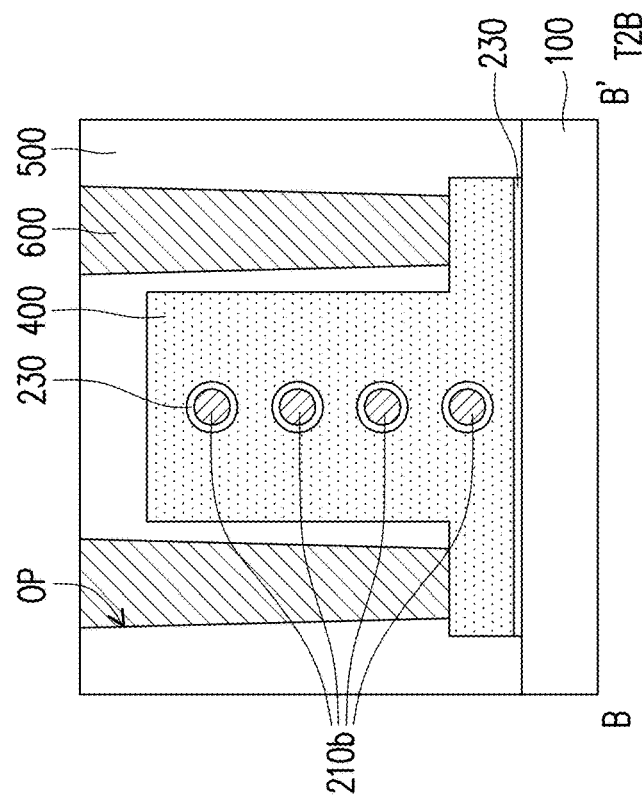
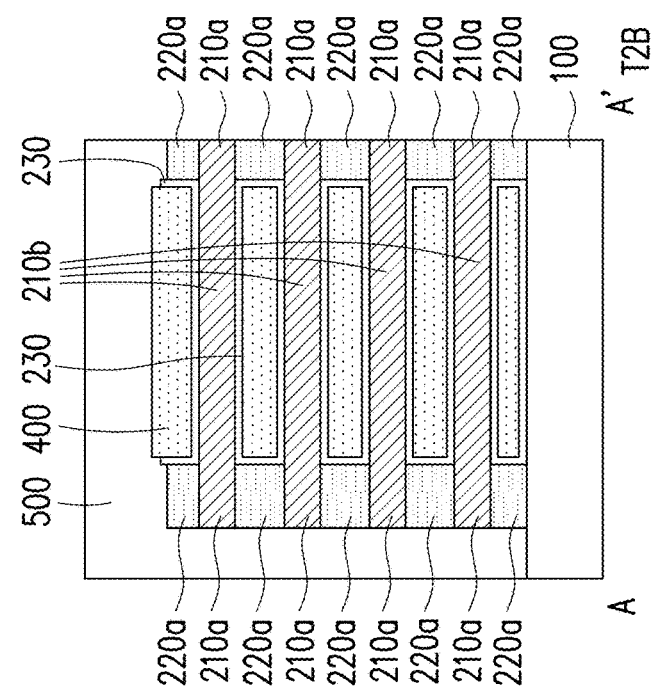
FIG. 6A
FIG. 6C
FIG. 6B

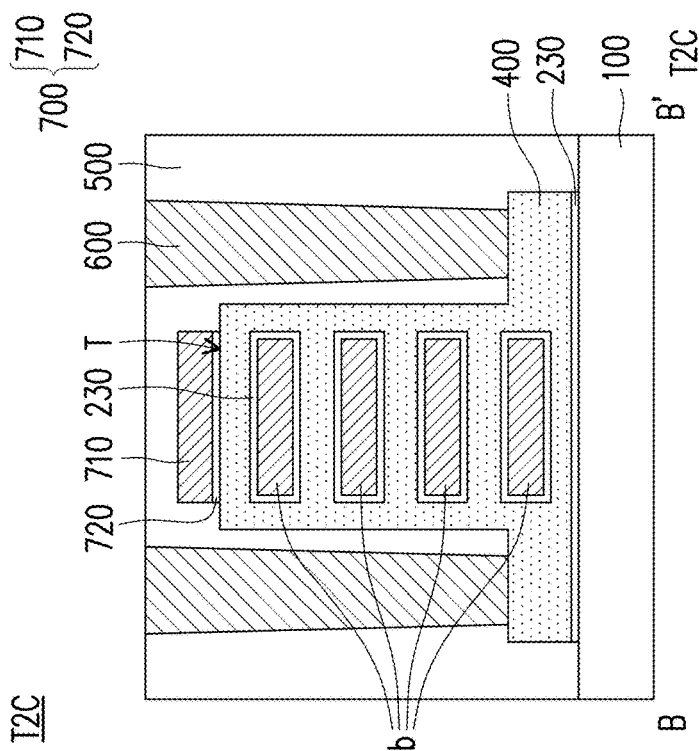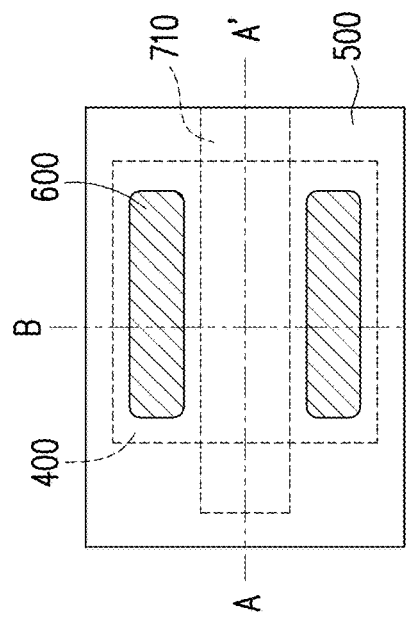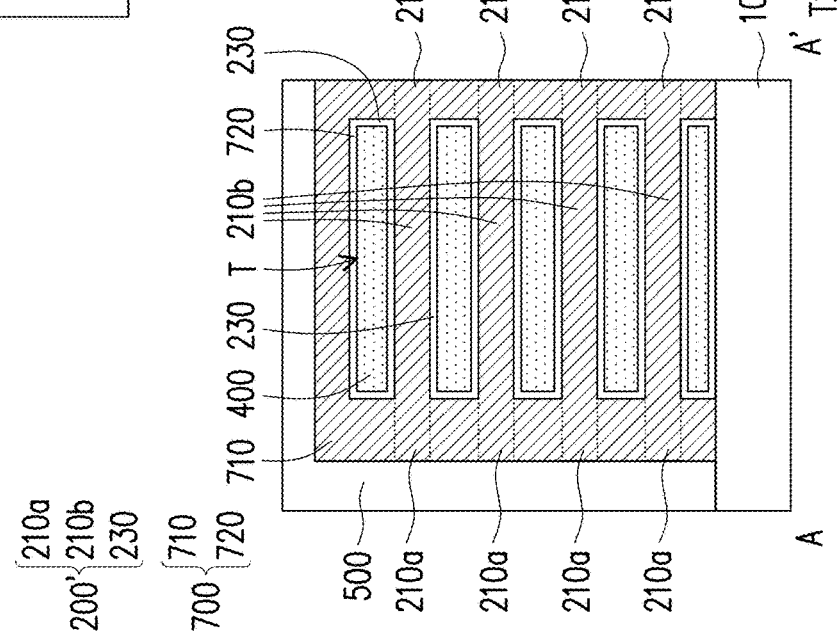
FIG. 7D
FIG. 8D
FIG. 9D

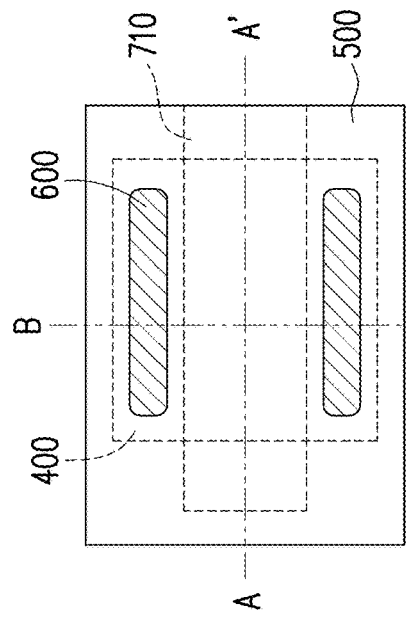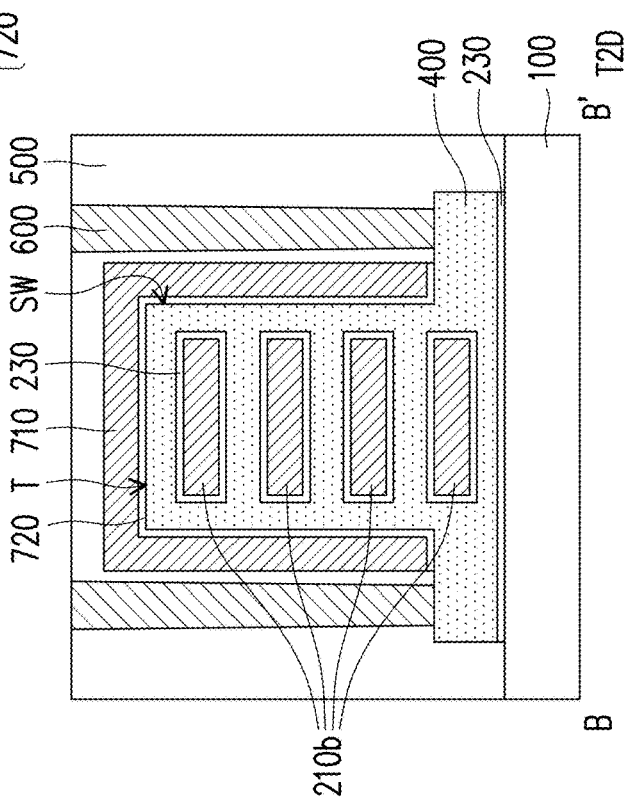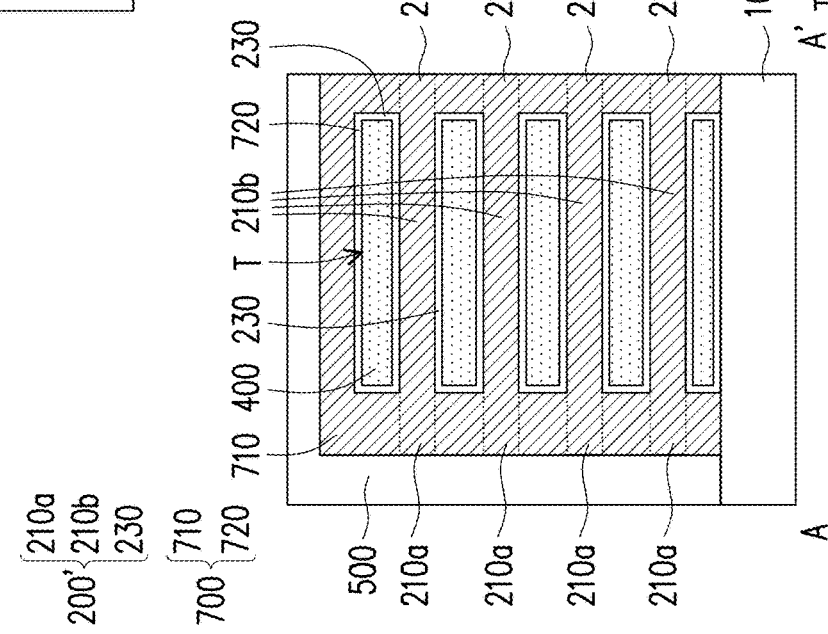
FIG. 10A
FIG. 10B
FIG. 10C

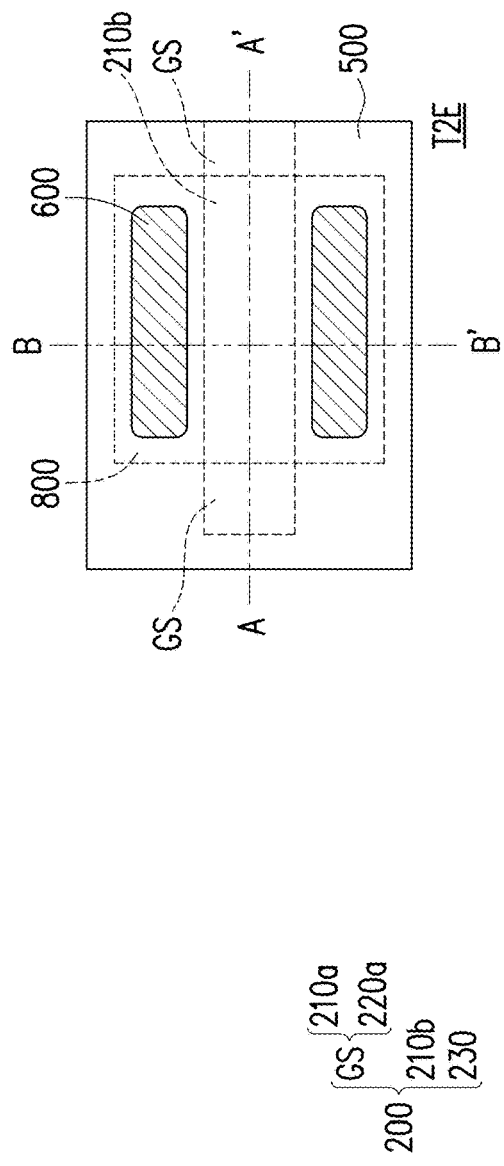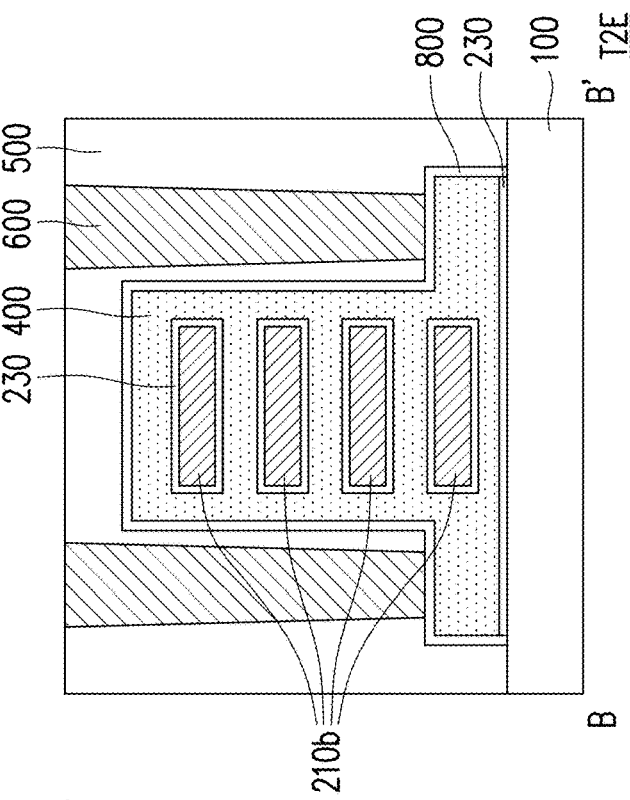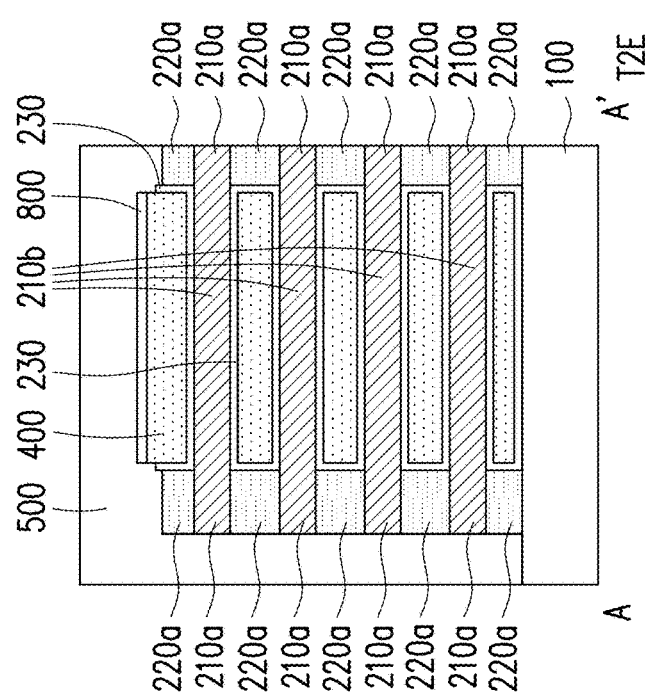

TRANSISTOR, INTEGRATED CIRCUIT, AND MANUFACTURING METHOD OF TRANSISTOR

CROSS-REFERENCE TO RELATED APPLICATION

This application is a continuation application of and claims the priority benefit of a prior application Ser. No. 18/165,936, filed on Feb. 8, 2023. The prior application Ser. No. 18/165,936 is a continuation application of and claims the priority benefit of a prior application Ser. No. 17/099,800, filed on Nov. 17, 2020. The prior application Ser. No. 17/099,800 claims the priority benefit of U.S. provisional application Ser. No. 63/030,929, filed on May 28, 2020. The entirety of each of the above-mentioned patent applications is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2J are top views illustrating various stages of a manufacturing method of the second transistor in FIG. 1.

FIG. 3A to FIG. 3J and FIG. 4A to FIG. 4J are cross-sectional views illustrating various stages of the manufacturing method of the second transistor in FIG. 2A to FIG. 2J.

FIG. 6A is a top view of a second transistor in accordance with some alternative embodiments of the disclosure.

FIG. 6B and FIG. 6C are cross-sectional views of the second transistor in FIG. 6A.

FIG. 7A to FIG. 7D are top views illustrating various stages of a manufacturing method of a second transistor in accordance with some alternative embodiments of the disclosure.

FIG. 8A to FIG. 8D and FIG. 9A to FIG. 9D are cross-sectional views illustrating various stages of the manufacturing method of the second transistor in FIG. 7A to FIG. 7D.

FIG. 10A is a top view of a second transistor in accordance with some alternative embodiments of the disclosure.

FIG. 10B and FIG. 10C are cross-sectional views of the second transistor in FIG. 10A.

FIG. 11A is a top view of a second transistor in accordance with some alternative embodiments of the disclosure.

FIG. 11B and FIG. 11C are cross-sectional views of the second transistor in FIG. 11A.

DETAILED DESCRIPTION

Figure 1:
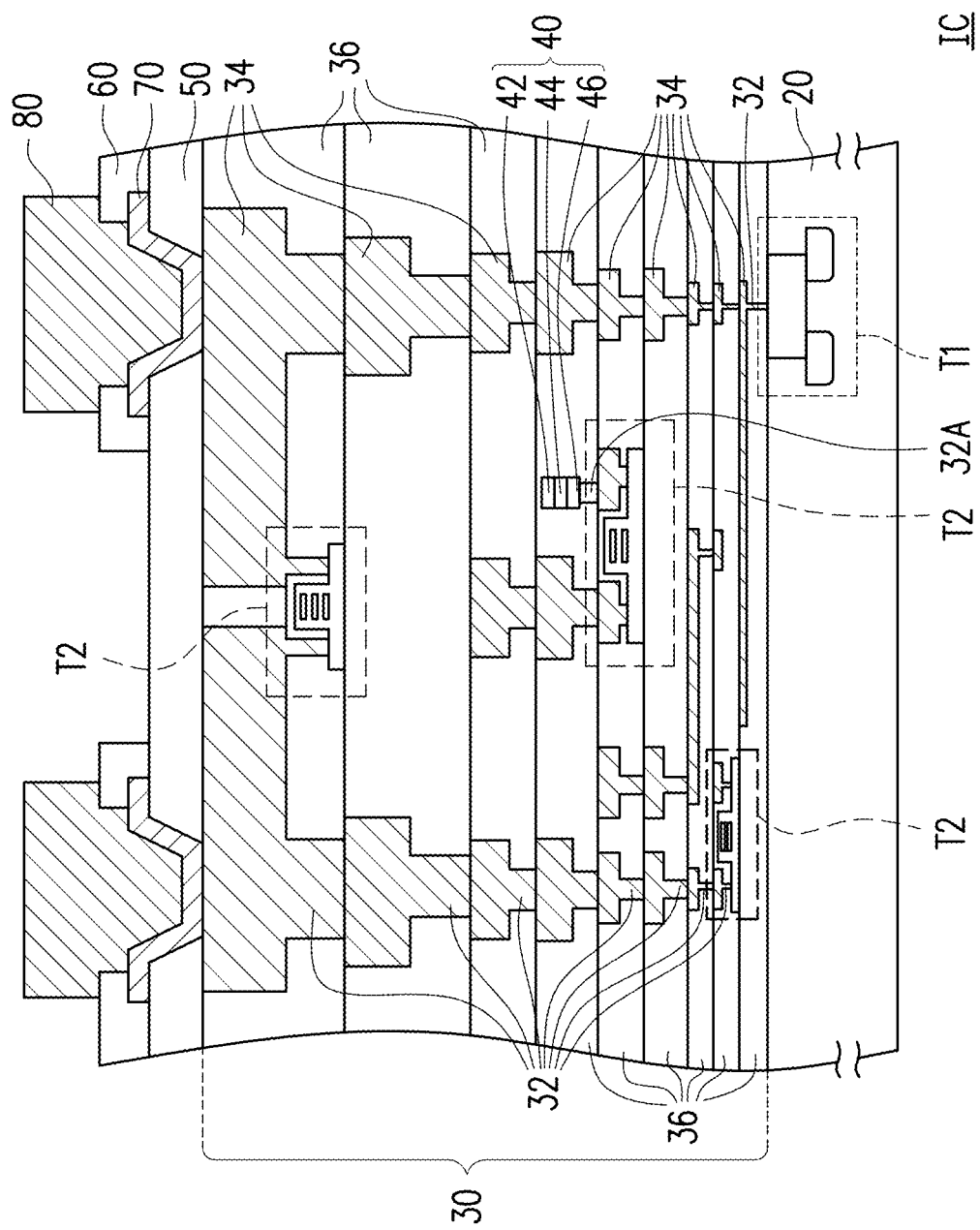
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit IC in accordance with some embodiments of the disclosure. In some embodiments, the integrated circuit IC includes a substrate 20, an interconnection structure 30, a passivation layer 50, a post-passivation layer 60, a plurality of conductive pads 70, and a plurality of conductive terminals 80. In some embodiments, the substrate 20 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 20 may be a bulk silicon substrate, a silicon-on-insulator (SOI) substrate, or a germanium-on-insulator (GOI) substrate.

In some embodiments, the substrate 20 includes various doped regions depending on circuit requirements (e.g., p-type semiconductor substrate or n-type semiconductor substrate). In some embodiments, the doped regions is doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a first transistor T1 embedded in the substrate 20. Depending on the types of the dopants in the doped regions, the first transistor T1 may be referred to as n-type transistor or p-type transistor. In some embodiments, the first transistor T1 further includes a metal gate and a channel under the metal gate. The channel is located between the source region and the drain region to serve as a path for electron to travel when the first transistor T1 is turned on. In some embodiments, the first transistor T1 is formed using suitable Front-end-of-line (FEOL) process. Depending on the circuit requirement, the first transistor T1 may be completely embedded in the substrate 20 or partially embedded in the substrate 20. For simplicity, one first transistor T1 is shown in FIG. 1. However, it should be understood that more than one first transistors T1 may be embedded in the substrate 20 depending on the application of the integrated circuit IC. When multiple first transistors T1 are presented, these first transistors T1 may be separated by shallow trench isolation (STI; not shown) located between two adjacent first transistors T1. That is, in some embodiments, the STI are also embedded in the substrate 20.

As illustrated in FIG. 1, the interconnection structure 30 is disposed on the substrate 20. In some embodiments, the interconnection structure 30 includes a plurality of conductive vias 32, a plurality of conductive patterns 34, a plurality of dielectric layers 36, a memory cell 40, and a plurality of second transistors T2. As illustrated in FIG. 1, the conductive patterns 34 are embedded in the dielectric layers 36. On the other hand, the conductive vias 32 penetrate through the dielectric layers 36. In some embodiments, the conductive patterns 34 located at different level heights are connected to one another through the conductive vias 32. In other words, the conductive patterns 34 are electrically connected to one another through the conductive vias 32. In some embodiments, the bottommost conductive vias 32 are connected to the first transistor T1 embedded in the substrate 20. In other words, the bottommost conductive vias 32 establish electrical connection between the first transistor T1 and the conductive patterns 34 of the interconnection structure 30. As illustrated in FIG. 1, the bottommost conductive via 32 is connected to the metal gate of the first transistor T1. It should be noted that in some alternative cross-sectional views, the bottommost conductive vias 32 are also connected to source/drain regions of the first transistor T1. That is, in some embodiments, the bottommost conductive vias 32 may be referred to as "contact structures" of the first transistor T1.

In some embodiments, a material of the dielectric layers 36 includes polyimide, epoxy resin, acrylic resin, phenol resin, benzocyclobutene (BCB), polybenzooxazole (PBO), or any other suitable polymer-based dielectric material. Alternatively, the dielectric layers 36 may be formed of oxides or nitrides, such as silicon oxide, silicon nitride, or the like. The dielectric layers 36 may be formed by suitable fabrication techniques such as spin-on coating, chemical vapor deposition (CVD), plasma-enhanced chemical vapor deposition (PECVD), or the like.

In some embodiments, a material of the conductive patterns 34 and the conductive vias 32 includes aluminum, titanium, copper, nickel, tungsten, or alloys thereof. The conductive patterns 34 and the conductive vias 32 may be formed by electroplating, deposition, and/or photolithography and etching. In some embodiments, the conductive patterns 34 and the underlying conductive vias 32 are formed simultaneously. It should be noted that the number of the dielectric layers 36, the number of the conductive patterns 34, and the number of the conductive vias 32 illustrated in FIG. 1 are merely for illustrative purposes, and the disclosure is not limited thereto. In some alternative embodiments, fewer or more layers of the dielectric layers 36, the conductive patterns 34, and/or the conductive vias 32 may be formed depending on the circuit design.

As illustrated in FIG. 1, the memory cell 40 is also embedded in the interconnection structure 30. For example, the memory cell 40 is embedded in the dielectric layers 36. In some embodiments, the memory cell 40 includes a top electrode 42, a storage layer 44, and a bottom electrode 46. The storage layer 44 is sandwiched between the top electrode 42 and the bottom electrode 46. In some embodiments, the memory cell 40 is electrically connected to the underlying conductive pattern 34 through a conductive via 32A located therebetween. In some embodiments, the conductive via 32A is similar to the conductive vias 32, so the detailed descriptions thereof are omitted herein.

In some embodiments, materials of the top electrode 42 and the bottom electrode 46 are identical. However, the disclosure is not limited thereto. In some alternative embodiments, the materials of the top electrode 42 may be different from the material of the bottom electrode 46. The material of the top electrode 42 and the bottom electrode 46 includes, for example, gold, platinum, ruthenium, iridium, titanium, aluminum, copper, tantalum, tungsten, an alloy thereof, an oxide thereof, a nitride thereof, a fluoride thereof, a carbide thereof, a boride thereof, a silicide thereof, or the like.

In some embodiments, the storage layer 44 includes a single or composite film of $HfO_2$, $Hr_{1-x}Zr_xO_2$, $ZrO_2$, $TiO_2$, $NiO$, $TaO_x$, $Cu_2O$, $Nb_2O_5$, $Al_2O_3$, $MoO_x$, $CoO$, $ZnO$, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like. The storage layer 44 may be formed by CVD, PECVD, flowable chemical vapor deposition (FCVD), high-density-plasma chemical vapor deposition (HDP-CVD), sub-atmospheric chemical vapor deposition (SACVD), physical vapor deposition (PVD), or atomic layer deposition (ALD). Since the storage layer 44 has a variable resistance, the storage layer 44 may be utilized to store data.

In some embodiments, the second transistors T2 are also embedded in the interconnection structure 30. For example, the second transistors T2 are embedded in the dielectric layers 36. As illustrated in FIG. 1, the conductive via 32A directly contacting the memory cell 40 is connected to one of the second transistors T2. In other words, the memory cell 40 is electrically connected to at least one of the second transistors T2. The formation method and the structure of the second transistors T2 will be described in detail later. In some embodiments, the second transistor T2 and the memory cell 40 are collectively referred to as a memory device. For example, the second transistor T2 may sever as a selector for the memory device. It should be noted that the memory device illustrated in FIG. 1 may be referred to as Resistive Random Access Memory (RRAM) device. However, the disclosure is not limited thereto. In some alternative embodiments, the memory cell 40 may be replaced with other types of memory cell to render Dynamic Random Access Memory (DRAM) device, Static Random Access Memory (SRAM) device, Magnetoresistive Random Access Memory (MRAM), or the like.

As illustrated in FIG. 1, the passivation layer 50, the conductive pads 70, the post-passivation layer 60, and the conductive terminals 80 are sequentially formed on the interconnection structure 30. In some embodiments, the passivation layer 50 is disposed on the topmost dielectric layer 36 and the topmost conductive patterns 34. In some embodiments, the passivation layer 50 has a plurality of openings partially exposing each topmost conductive pattern 34. In some embodiments, the passivation layer 50 is a silicon oxide layer, a silicon nitride layer, a silicon oxynitride layer, or a dielectric layer formed by other suitable dielectric materials. The passivation layer 50 may be formed by suitable fabrication techniques such as HDP-CVD, PECVD, or the like.

In some embodiments, the conductive pads 70 are formed over the passivation layer 50. In some embodiments, the conductive pads 70 extend into the openings of the passivation layer 50 to be in direct contact with the topmost conductive patterns 34. That is, the conductive pads 70 are electrically connected to the interconnection structure 30. In some embodiments, the conductive pads 70 include aluminum pads, copper pads, titanium pads, nickel pads, tungsten pads, or other suitable metal pads. The conductive pads 70 may be formed by, for example, electroplating, deposition, and/or photolithography and etching. It should be noted that the number and the shape of the conductive pads 70 illustrated in FIG. 1 are merely for illustrative purposes, and the disclosure is not limited thereto. In some alternative embodiments, the number and the shape of the conductive pad 70 may be adjusted based on demand.

In some embodiments, the post-passivation layer 60 is formed over the passivation layer 50 and the conductive pads 70. In some embodiments, the post-passivation layer 60 is formed on the conductive pads 70 to protect the conductive pads 70. In some embodiments, the post-passivation layer 60 has a plurality of contact openings partially exposing each conductive pad 70. The post-passivation layer 60 may be a polyimide layer, a PBO layer, or a dielectric layer formed by other suitable polymers. In some embodiments, the post-passivation layer 60 is formed by suitable fabrication techniques such as HDP-CVD, PECVD, or the like.

As illustrated in FIG. 1, the conductive terminals 80 are formed over the post-passivation layer 60 and the conductive pads 70. In some embodiments, the conductive terminals 80 extend into the contact openings of the post-passivation layer 60 to be in direct contact with the corresponding conductive pad 70. That is, the conductive terminals 80 are electrically connected to the interconnection structure 30 through the conductive pads 70. In some embodiments, the conductive terminals 80 are conductive pillars, conductive posts, conductive balls, conductive bumps, or the like. In some embodiments, a material of the conductive terminals 80 includes a variety of metals, metal alloys, or metals and mixture of other materials. For example, the conductive terminals 80 may be made of aluminum, titanium, copper, nickel, tungsten, tin, and/or alloys thereof. The conductive terminals 80 are formed by, for example, deposition, electroplating, screen printing, or other suitable methods. In some embodiments, the conductive terminals 80 are used to establish electrical connection with other components (not shown) subsequently formed or provided.

As mentioned above, the second transistors T2 are embedded in the interconnection structure 30, and at least one of the second transistors T2 is electrically connected to the memory cell 40. In some embodiments, the second transistors T2 are thin film transistors (TFT). Taking the second transistor T2 located directly underneath the memory cell 40 as an example, the formation method and the structure of this second transistor T2 will be described below in conjunction with FIG. 2A to FIG. 2J, FIG. 3A to FIG. 3J, and FIG. 4A to FIG. 4J.

FIG. 2A to FIG. 2J are top views illustrating various stages of a manufacturing method of the second transistor T2 in FIG. 1. FIG. 3A to FIG. 3J and FIG. 4A to FIG. 4J are cross-sectional views illustrating various stages of the manufacturing method of the second transistor T2 in FIG. 2A to FIG. 2J. It should be noted that the cross-sectional views of FIG. 3A to FIG. 3J are taken along cross-sectional line A-A' in FIG. 2A to FIG. 2J and the cross-sectional views of FIG. 4A to FIG. 4J are taken along cross sectional line B-B' in FIG. 2A to FIG. 2J.

Figure 2A:
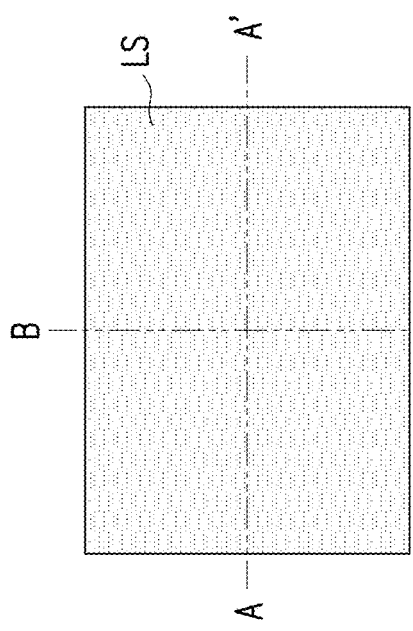
Figure 4A:
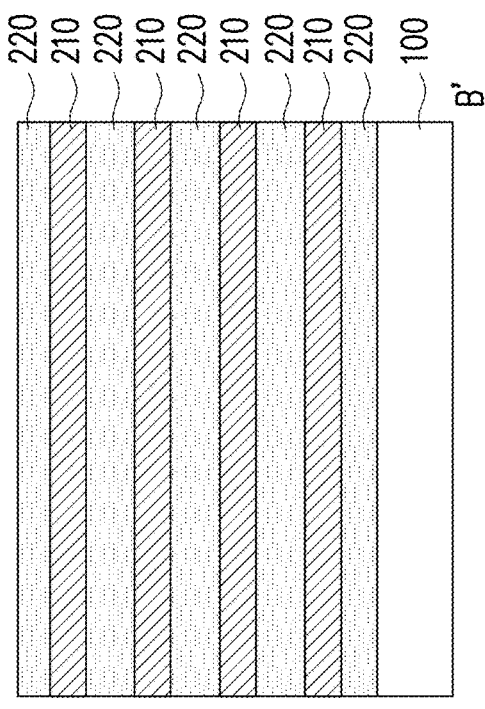
Figure 3A:
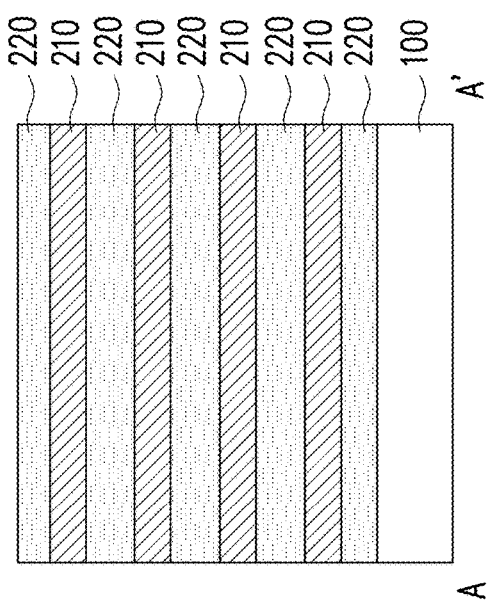

Referring to FIG. 2A, FIG. 3A, and FIG. 4A, a first dielectric layer 100 is provided. In some embodiments, the first dielectric layer 100 is one of the dielectric layers 36 of the interconnection structure 30 of FIG. 1, so the detailed description thereof is omitted herein. As illustrated in FIG. 3A and FIG. 4A, a stack LS is formed on the first dielectric layer 100. In some embodiments, the stack LS includes a plurality of first material layers 210 and a plurality of second material layers 220 alternately stacked on one another. For example, the first material layer 210 is sandwiched between two adjacent second material layers 220.

In some embodiments, the first material layers 210 are made of a conductive material. For example, the first material layers 210 may be made of copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the first material layers 210 also include materials to fine-tune the corresponding work function. For example, the first material layers 210 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof.

In some embodiments, a material of the second material layers 220 is not particularly limited, as long as said material renders good etching selectivity between the first material layer 210 and the second material layer 220. For example, the second material layer 220 may be made of a conductive material, a semiconductor material, or a dielectric material. Examples of the conductive material includes copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. Examples of the semiconductor material includes elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. Examples of the dielectric material includes polyimide, epoxy resin, acrylic resin, phenol resin, BCB, PBO, silicon oxide, silicon nitride, or any other suitable polymer-based dielectric material.

In some embodiments, an etching selectivity between the first material layer 210 and the second material layer 220 is high. For example, the etching selectivity between the first material layer 210 and the second material layer 220 ranges between 1:10 and 1:10000. Herein, the etching selectivity is denoted by a ratio between an etch rate of the first material layer 210 and an etch rate of the second material layer 220.

In some embodiments, a barrier layer (not shown) is optionally formed between the first material layer 210 and the second material layer 220, so as to avoid diffusion of atoms between elements. In some embodiments, materials of the barrier layer includes titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof.

In some embodiments, the first material layer 210 and the second material layer 220 are deposited on the first dielectric layer 100 through ALD, CVD, PVD, or the like. As illustrated in FIG. 3A and FIG. 4A, the second material layer 220 and the first material layer 210 are alternately deposited on the first dielectric layer 100 to form the stack LS.

Figure 2B:
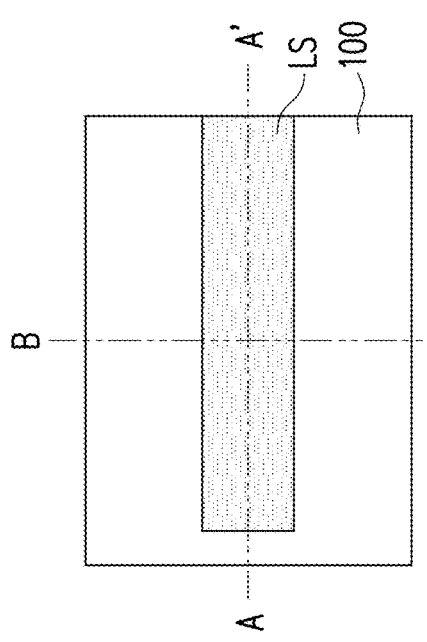
Figure 4B:
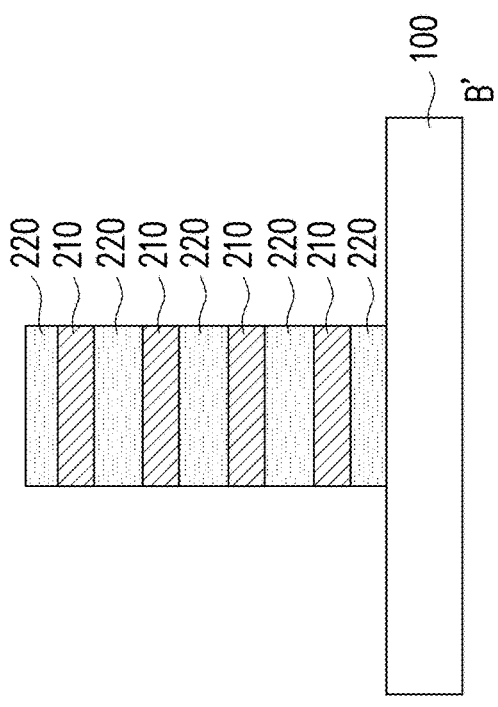
Figure 3B:
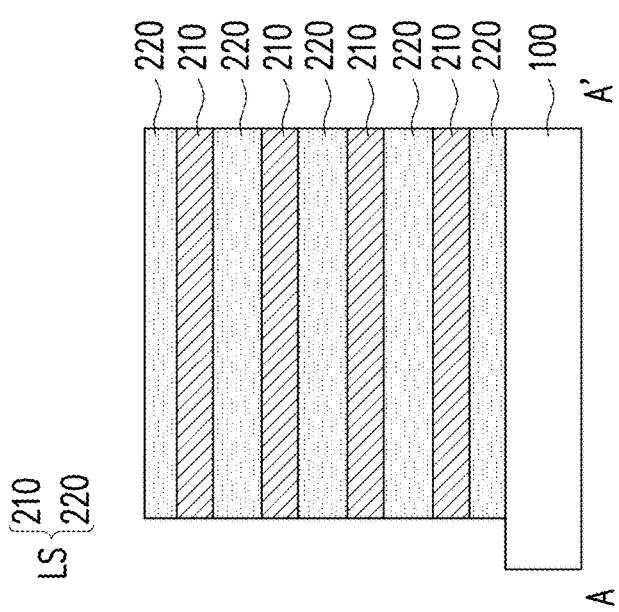

Referring to FIG. 2B, FIG. 3B, and FIG. 4B, the stack LS is patterned. For example, a portion of the stack LS is removed to expose the underlying first dielectric layer 100. In some embodiments, the stack LS is patterned through a lithography process and an etching process. The lithography process includes, for example, photoresist coating, soft baking, exposing, post-exposure baking (PEB), developing, and hard baking. The etching process includes, for example, an anisotropic etching process such as dry etch or an isotropic etching process such as wet etch.

Referring to FIG. 2C, FIG. 3C, and FIG. 4C, a patterned mask layer 300 is formed over the first dielectric layer 100 and the stack LS. In some embodiments, the patterned mask layer 300 has an aperture AP exposing at least a portion of the stack LS to define an active area of the subsequently formed device. For example, the aperture AP of the patterned mask layer 300 partially exposes a top surface of the topmost second material layer 220. Meanwhile, the aperture AP of the patterned mask layer 300 also partially exposes a first sidewall SW1 and a second sidewall SW2 of the stack LS. That is, the aperture AP of the patterned mask layer 300 partially exposes the first material layer 210 and the second material layer 220. In some embodiments, the patterned mask layer 300 is a silicon oxide layer. However, the disclosure is not limited thereto. In some alternative embodiments, the patterned mask layer 300 may be a silicon nitride layer. In some embodiments, the patterned mask layer 300 is formed by low-pressure chemical vapor deposition (LPCVD) or PECVD. In some alternative embodiments, the patterned mask layer 300 may be formed by thermal oxidation or nitridation of silicon. In some embodiments, the patterned mask layer 300 is formed to have a thickness ranging from about 5 nm to about 50 nm. In some embodiments, the patterned mask layer 300 is used as a hard mask during the subsequently photolithography and etching process.

Referring to FIG. 2C to FIG. 2D, FIG. 3C to FIG. 3D, and FIG. 4C to FIG. 4D, the stack LS is further patterned to form a plurality of stacking structures GS and a plurality of nanosheets 210b connecting the stacking structures GS. For example, the second material layer 220 exposed by the aperture AP of the patterned mask layer 300 is removed to obtain the stacking structures GS and the nanosheets 210b. In some embodiments, the second material layers 220 are removed through an etching process. The etching process includes, for example, an anisotropic etching process such as dry etch or an isotropic etching process such as wet etch. In some embodiments, an etchant for the wet etch includes a combination of hydrogen fluoride (HF) and ammonia ($NH_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. As mentioned above, the aperture AP of the patterned mask layer 300 partially exposes the top surface of the topmost second material layer 220, the first sidewall SW1 of the stack LS, and the second sidewall SW2 of the stack LS. As such, during the etching process, the etchant may remove the second material layer 220 from the top and the sides of the exposed portion of the stack LS. As mentioned above, the etching selectivity between the first material layer 210 and the second material layer 220 is high. Therefore, during the etching process, the etchant may selectively remove the exposed second material layer 220 without damaging the exposed first material layer 210.

After the patterning process of the stack LS, each first material layer 210 is divided into a plurality of first material layers 210a and a nanosheet 210b connecting the first material layers 210a. In some embodiments, the nanosheets 210b are exposed while the first material layers 210a are sandwiched between the remaining second material layers 220a. In some embodiments, the remaining second material layers 220a and the first material layers 210a sandwiched between the remaining second material layers 220a are collectively referred to as the stacking structures GS. That is, each stacking structure GS includes a laminate structure of the first material layers 210a and the second material layers 220a alternately stacked on one another. In some embodiments, the stacking structures GS are spatially separated from each other and are connected by the nanosheets 210b located therebetween. In some embodiments, since the first material layers 210a of the stacking structures GS and the corresponding nanosheets 210b are formed by the same layer (i.e. the first material layer 210), the material of the first material layers 210a and the material of the nanosheets 210b are the same.

Figure 4D:
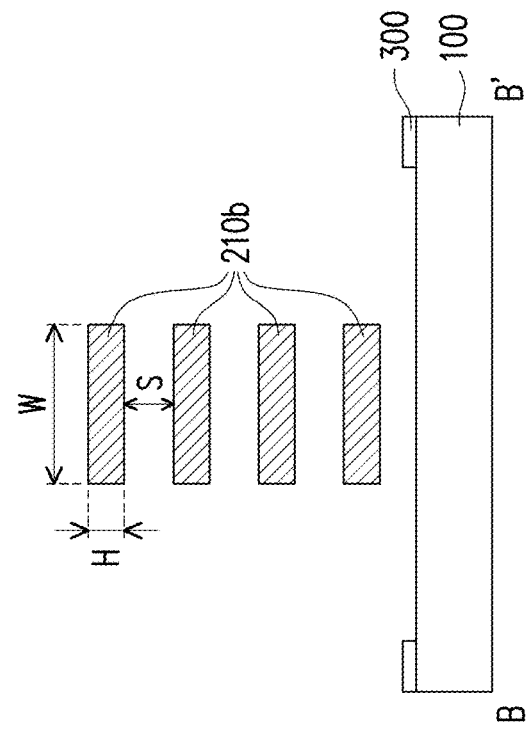
Figure 2D:
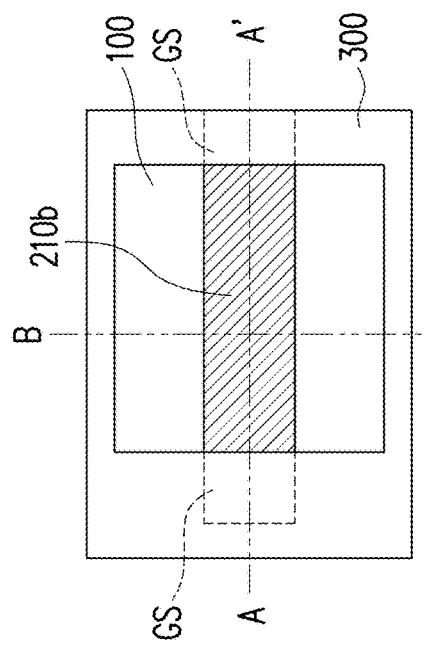
Figure 3D:
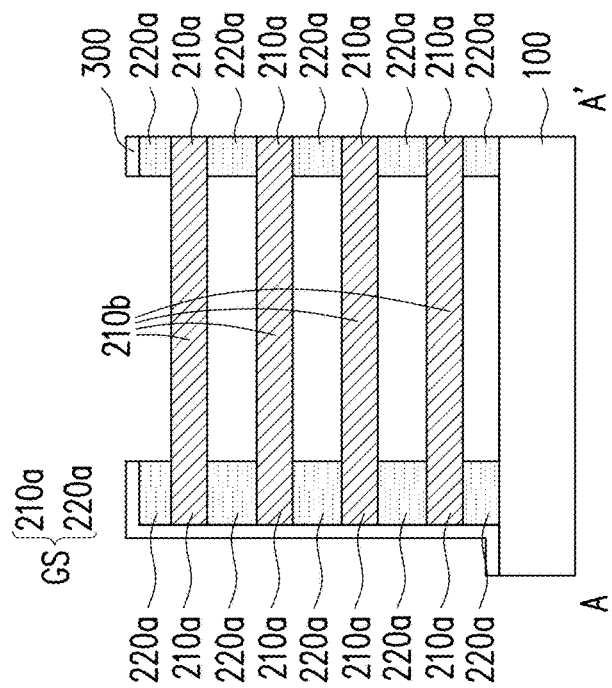

In some embodiments, the nanosheets 210b are stacked vertically apart. In some embodiments, each nanosheet 210b has a width W of about 10 nm to about 100 nm. On the other hand, each nanosheet 210b has a height H of about 3 nm to about 20 nm. Moreover, a spacing S between two adjacent nanosheets 210b ranges from about 10 nm to about 30 nm. In some embodiments, the cross-sectional view of each nanosheet 210b is rectangular with straight edges and sharp corners, as illustrated in FIG. 4D. However, the disclosure is not limited thereto. The cross-sectional view of the nanosheets 201b may exhibit other shapes, and the configuration thereof will be discussed later.

Referring to FIG. 2E, FIG. 3E, and FIG. 4E, a gate dielectric layer 230 is formed on the first dielectric layer 100, the patterned mask layer 300, the stacking structures GS, and the nanosheets 210b. In some embodiments, the gate dielectric layer 230 is formed to conformally cover a surface of the first dielectric layer 100, a surface of the patterned mask layer 300, surfaces of the exposed portion of the stacking structure GS, and surfaces of the nanosheets 210b. For example, as illustrated in FIG. 3E, the gate dielectric layer 230 covers the surface of the first dielectric layer 100, the surface of the patterned mask layer 300, a portion of surfaces of the second material layers 220a in the stacking structures GS, and the surfaces of the nanosheets 210b. In some embodiments, the gate dielectric layer 230 wraps around the nanosheets 210b, as illustrated in FIG. 4E.

In some embodiments, the gate dielectric layer 230 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the gate dielectric layer 230 includes metal oxides, metal nitrides, metal silicates, transition metal-oxides, transition metal-nitrides, transition metal-silicates, oxynitrides of metals, metal aluminates, or combinations thereof. For example, the gate dielectric layer 230 includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. In some embodiments, the gate dielectric layer 230 includes an interfacial layer (not shown) formed between the nanosheets 210b and the dielectric material. The gate dielectric layer 230 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. In some embodiments, a thickness of the gate dielectric layer 230 ranges from about 0.5 nm to about 10 nm.

Figure 4F:
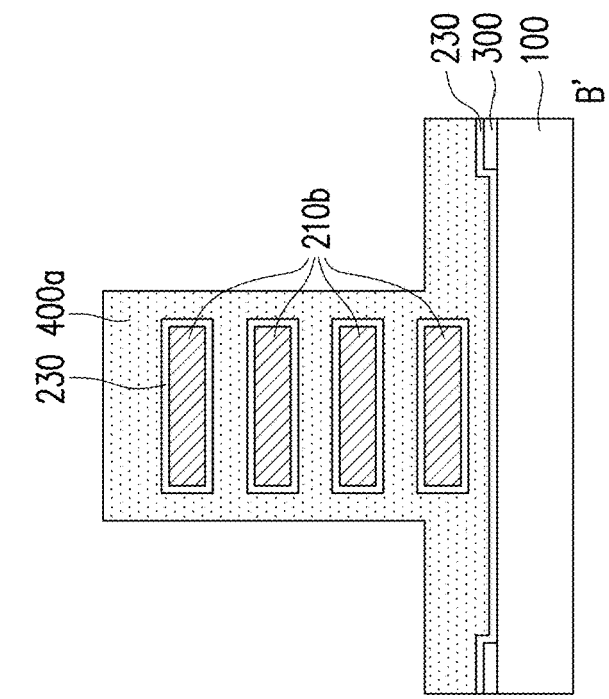
Figure 2F:
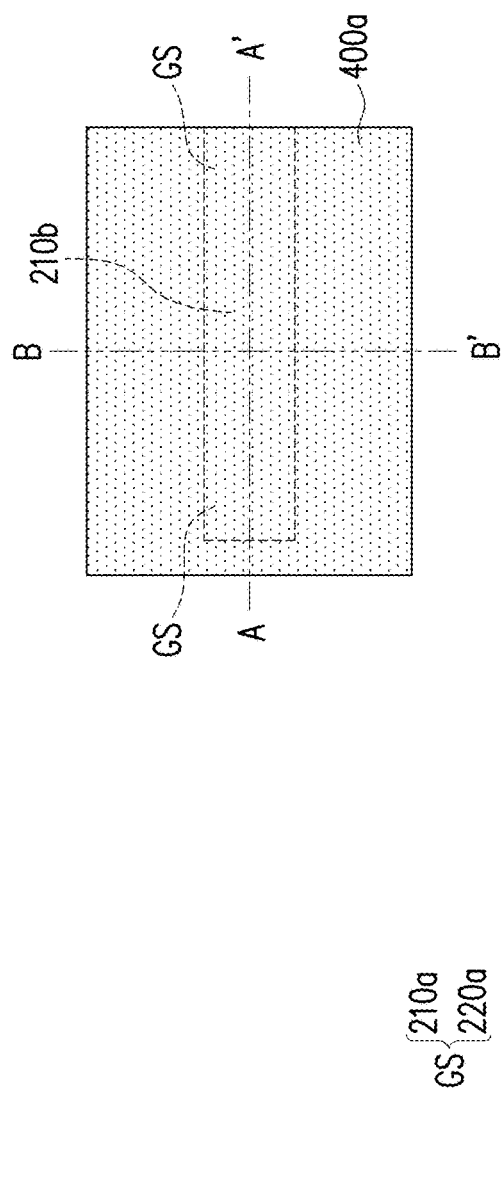
Figure 3F:
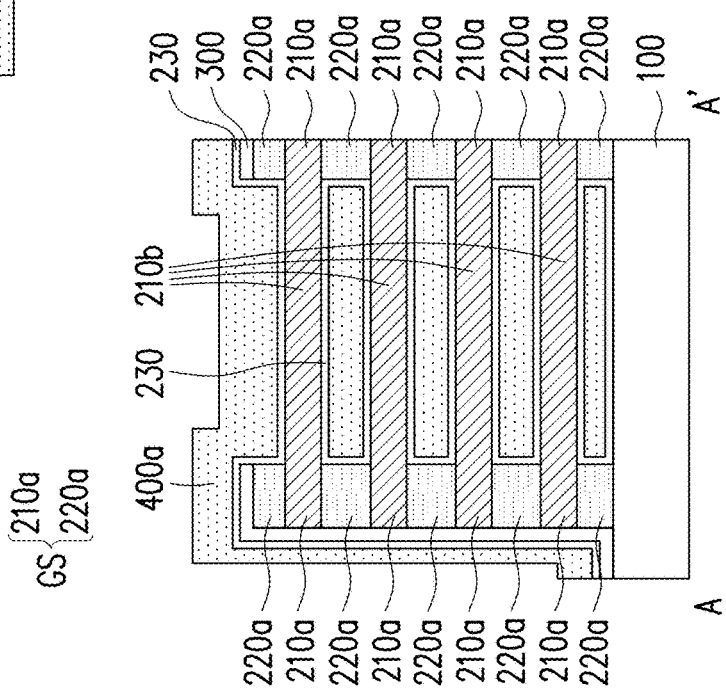

Referring to FIG. 2F, FIG. 3F, and FIG. 4F, a channel material layer 400a is conformally formed over the gate dielectric layer 230. For example, the channel material layer 400a is formed over the gate dielectric layer 230 and the nanosheets 210b to wrap around the nanosheets 210b and the gate dielectric layer 230 disposed on the nanosheets 210b. In some embodiments, the channel material layer 400a is made of various semiconductor materials. The material of the channel material layer 400a includes, for example, IGZO, Indium, Gallium, Zinc, InWO, InZo, InSnO, GaO, InO, or a combination thereof. In some embodiments, the channel material layer 400a is made of a single layer having one of the foregoing materials. However, the disclosure is not limited thereto. In some alternative embodiments, the channel material layer 400a may be made of a laminate structure of at least two of the foregoing materials. In some embodiments, the channel material layer 400a is doped with a dopant to achieve extra stability. For example, the channel material layer 400a may be doped with silicon dopant or the like. In some embodiments, the channel material layer 400a is deposited by suitable techniques, such as CVD, ALD, PVD, PECVD, epitaxial growth, or the like. For example, the channel material layer 400a may be conformally deposited on the gate dielectric layer 230 through ALD.

Referring to FIG. 2F to FIG. 2G, FIG. 3F to FIG. 3G, and FIG. 4F to FIG. 4G, a portion of the channel material layer 400a, a portion of the gate dielectric layer 230, and the patterned mask layer 300 are removed to form a gate structure 200 and a channel layer 400. In some embodiments, the portion of the channel material layer 400a, the portion of the gate dielectric layer 230, and the patterned mask layer 300 are removed by an etching process. The etching process includes, for example, an anisotropic etching process such as dry etch or an isotropic etching process such as wet etch. However, the disclosure is not limited thereto. In some alternative embodiments, the portion of the channel material layer 400a, the portion of the gate dielectric layer 230, and the patterned mask layer 300 are removed by a planarization process. The planarization process includes, for example, a mechanical grinding process, a chemical mechanical polishing (CMP) process, or the like. In some embodiments, the portion of the channel material layer 400a, the portion of the gate dielectric layer 230, and the patterned mask layer 300 are removed until the stacking structures GS and the first dielectric layer 100 are exposed. For example, after the removing process, the second material layers 220a of the stacking structures GS are exposed. In some embodiments, the channel layer 400 is formed to have a thickness of about 1 nm to about 20 nm. In some embodiments, the removal of the patterned mask layer 300 is optional. In other words, the patterned mask layer 300 may remain on the stacking structures GS to protect the stacking structures GS.

Figure 4G:
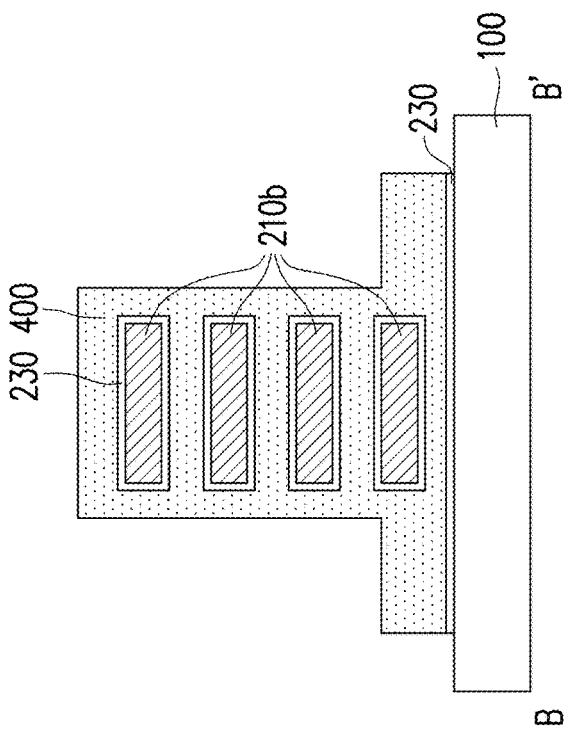
Figure 3G:
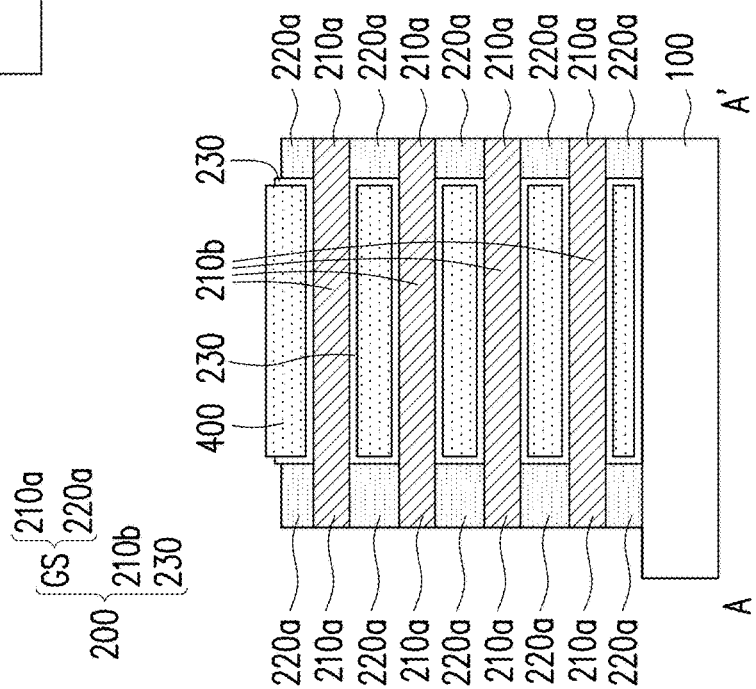

As illustrated in FIG. 3G and FIG. 4G, the gate structure 200 includes the stacking structures GS, the nanosheets 210b, and the gate dielectric layer 230. In some embodiments, the stacking structures GS and the nanosheets 210b are collectively referred to as a gate electrode of the gate structure 200. In some embodiments, the channel layer 400 is disposed over the gate structure 200. In some embodiments, the channel layer 400 is located between the stacking structures GS. That is, the stacking structures GS are disposed on opposite sides of the channel layer 400. Meanwhile, the stacking structures GS are connected by the nanosheets 210b located between the stacking structures GS. As such, the nanosheets 210b penetrate through the channel layer 400 to connect the stacking structures GS. For example, at least a portion of the channel layer 400 is disposed over the nanosheets 210b to wrap around the nanosheets 210b and the gate dielectric layer 230 disposed on the nanosheets 210b. In some embodiments, a first portion of the gate dielectric layer 230 is sandwiched between the nanosheets 210b and the channel layer 400. Meanwhile, a second portion of the gate dielectric layer 230 is sandwiched between the stacking structures GS and the channel layer 400. For example, the second portion of the gate dielectric layer 230 is sandwiched between the second material layers 220a of the stacking structures GS and the channel layer 400. Moreover, a third portion of the gate dielectric layer 230 is sandwiched between the first dielectric layer 100 and the channel layer 400.

In some embodiments, a top surface of the channel layer 400, a top surface of the gate dielectric layer 230, and top surfaces of the stacking structures GS (i.e. the top surface of the topmost second material layer 220a) are not located at the same level height. For example, as illustrated in FIG. 3G, the top surface of the channel layer 400, the top surface of the gate dielectric layer 230, and the top surfaces of the stacking structures GS exhibit a staircase shape from the cross-sectional view. In other words, a portion of the gate dielectric layer 230 protrudes from the top surfaces of the stacking structures GS, and a portion of the channel layer 400 protrudes from the top surface of the gate dielectric layer 230. However, the disclosure is not limited thereto. In some alternative embodiments, the top surface of the channel layer 400, the top surface of the gate dielectric layer 230, and the top surfaces of the stacking structures GS may be substantially coplanar with one another (shown in FIG. 8A).

As mentioned above, since the channel layer 400 wraps around the nanosheets 210b of the gate structure 200, the subsequently formed transistor may be referred to as "channel-all-around" transistor. In some embodiments, by allowing the gate structure 200 to include nanosheets 210b, the contact area between the channel layer 400 and the gate structure 200 (i.e. the nanosheets 210b) may be sufficiently increased. In other words, the effective width (along an extending direction of the cross-sectional line A-A' in FIG. 2G) of the subsequently formed transistor may be effectively increased to render improved electrical performance.

Referring to FIG. 2H, FIG. 3H, and FIG. 4H, a second dielectric layer 500 is formed over the first dielectric layer 100, the stacking structures GS, the gate dielectric layer 230, and the channel layer 400. In some embodiments, the second dielectric layer 500 covers the gate structure 200 and the channel layer 400. In other words, the gate structure 200 and the channel layer 400 are well protected and not exposed by the second dielectric layer 500. As mentioned above, the first dielectric layer 100 is one of dielectric layers 36 of the interconnection structure 30 of FIG. 1. Similarly, the second dielectric layer 500 is another one of the dielectric layers 36 of the interconnection structure 30 of FIG. 1, so the detailed description thereof is omitted herein. In some embodiments, the material of the first dielectric layer 100 and the material of the second dielectric layer 500 are identical. However, the disclosure is not limited thereto. In some alternative embodiments, the material of the first dielectric layer 100 may be different from the material of the second dielectric layer 500. In some embodiments, the second dielectric layer 500 is referred to as an interlayer dielectric layer.

Referring to FIG. 2I, FIG. 3I, and FIG. 4I, a plurality of contact openings OP is formed in the second dielectric layer 500. For example, the contact openings OP are formed through the second dielectric layer 500 near two ends of the channel layer 400. In some embodiments, the contact openings OP extend from a top surface of the second dielectric layer 500 to the top surface of the channel layer 400. That is, the contact openings OP penetrate through the second dielectric layer 500 to partially expose the channel layer 400. In some embodiments, the contact openings OP are formed by performing an etching process on the second dielectric layer 500. The etching process includes, for example, an anisotropic etching process such as dry etch or an isotropic etching process such as wet etch. As illustrated in FIG. 4I, the contact openings OP are formed aside the nanosheets 210b.

Referring to FIG. 2I to FIG. 2J, FIG. 3I to FIG. 3J, and FIG. 4I to FIG. 4J, after the contact openings OP are formed, a conductive material (not shown) is filled into the contacts openings OP and is formed over the second dielectric layer 500. Thereafter, the conductive material is partially removed until the second dielectric layer 500 is exposed, so as to form source/drain contacts 600 aside the nanosheets 210b. In some embodiments, the conductive material is partially removed through a mechanical grinding process, a CMP process, or the like. In some embodiments, the conductive material of the source/drain contacts 600 includes cobalt, tungsten, copper, titanium, tantalum, aluminum, zirconium, hafnium, a combination thereof, or other suitable conductive materials. In some embodiments, the conductive material of the source/drain contacts 600 is formed through CVD, ALD, plating, or other suitable deposition techniques. In some embodiments, a barrier layer (not shown) is optionally formed between the source/drain contacts 600 and the second dielectric layer 500, so as to avoid diffusion of atoms between elements. The barrier layer includes, for example, TiN, TaN, TiSiN, TaSiN, WSiN, TiC, TaC, TiAlC, TaAlC, TiAlN, TaAlN, or a combination thereof. In some embodiments, the source/drain contacts 600 penetrate through the second dielectric layer 500 to be in direct contact with two ends of the channel layer 400. That is, the source/drain contacts 600 are electrically connected to the channel layer 400. After the source/drain contacts 600 are formed, the formation of the second transistor T2 is substantially completed.

In some embodiments, the source/drain contacts 600 serve as the source and the drain of the second transistor T2. However, the disclosure is not limited thereto. In some alternative embodiments, source/drain patterns (not shown) may be formed between the channel layer 400 and the source/drain contacts 600. Under this scenario, the source/drain patterns serve as the source and the drain of the second transistor T2, and the source/drain contacts 600 serve as contact plugs for transmitting signal between the source/drain patterns and other components.

As mentioned above, the second transistors T2 may be a selector for a memory device. However, the disclosure is not limited thereto. In some alternative embodiments, the second transistors T2 may be power gates used to switch off logic blocks in standby or input/output (I/O) devices acting as the interface between a computing element (such as a CPU) and the outside world (such as a hard drive).

Figure 4J:
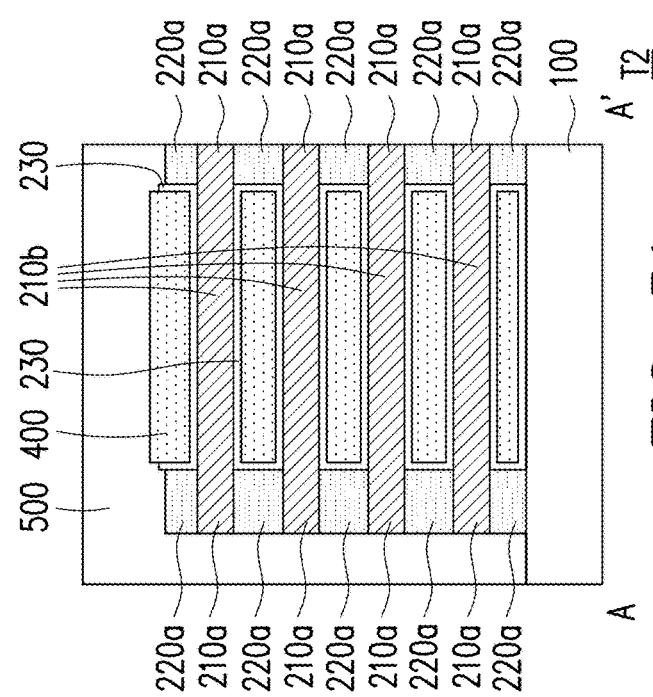

Referring to FIG. 1 and FIG. 4J, the source/drain contacts 600 extend from the channel layer 400 to the conductive pads 34 of the interconnection structure 30. In other words, the second transistors T2 is electrically connected to the first transistor T1 and the conductive terminals 80 through the conductive vias 32 and the conductive patterns 34 of the interconnection structure 30. In some embodiments, the second transistor T2 is embedded in the interconnection structure 30, which is being considered as formed during back-end-of-line (BEOL) process. That is, the second transistor T2 may be manufactured at low temperature, which is compatible with the thermal budget (i.e. the process temperature window) of the BEOL process. As such, the second transistor T2 does not use up valuable front-end chip area and the device size may be further reduced.

Figure 5A:
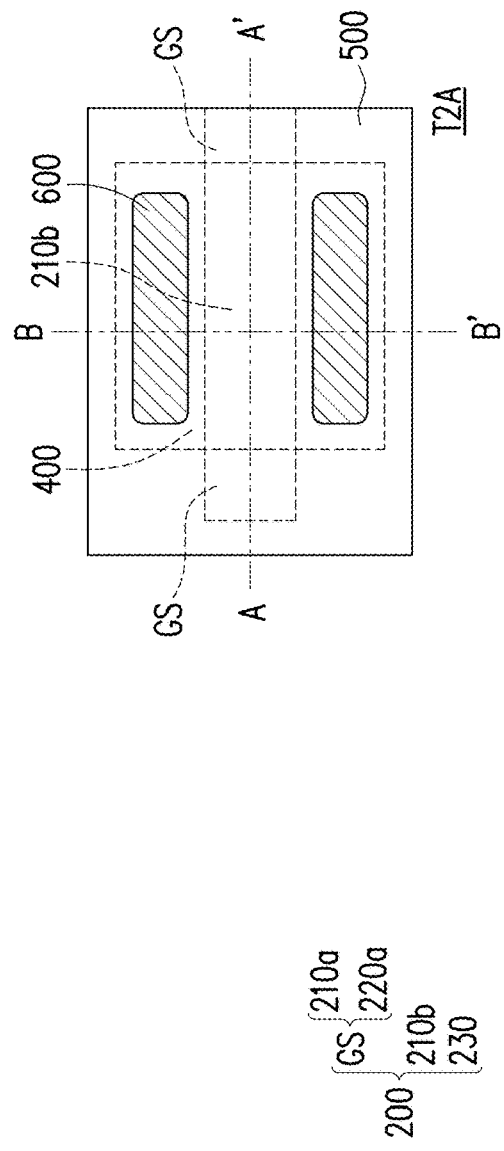
FIG. 5A is a top view of a second transistor in accordance with some alternative embodiments of the disclosure.
Figure 5C:
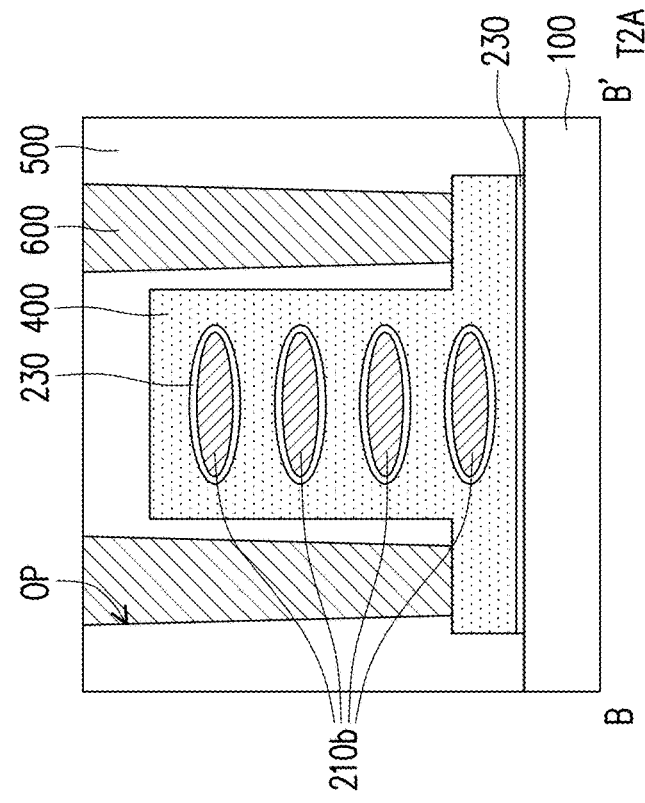
FIG. 5B and FIG. 5C are cross-sectional views of the second transistor in FIG. 5A.
Figure 5B:
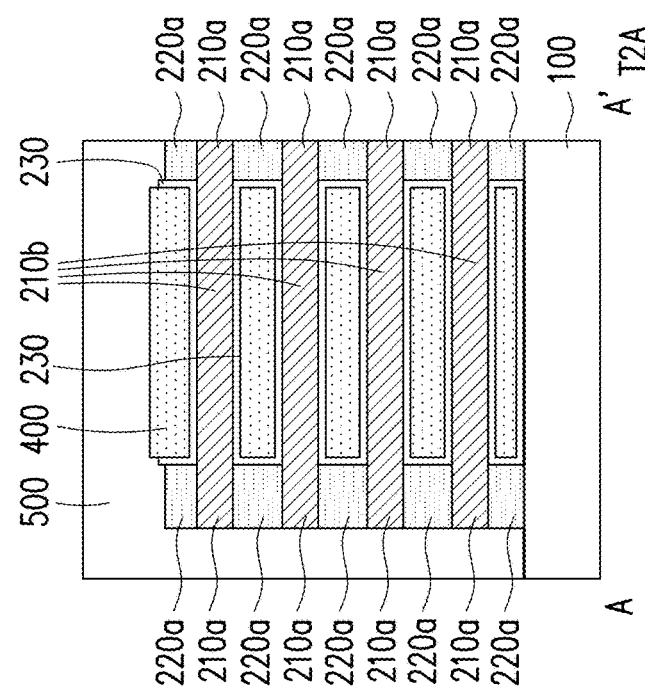

FIG. 5A is a top view of a second transistor T2A in accordance with some alternative embodiments of the disclosure. FIG. 5B and FIG. 5C are cross-sectional views of the second transistor T2A in FIG. 5A. It should be noted that the cross-sectional view of FIG. 5B is taken along cross-sectional line A-A' in FIG. 5A and the cross-sectional view of FIG. 5C is taken along cross-sectional line B-B' in FIG. 5A.

Figure 2G:
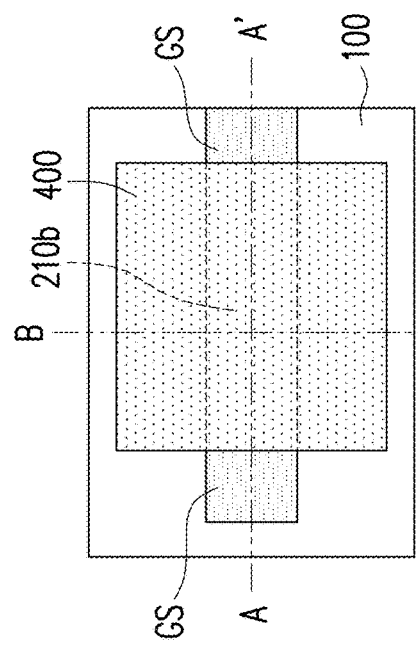
Figure 2J:
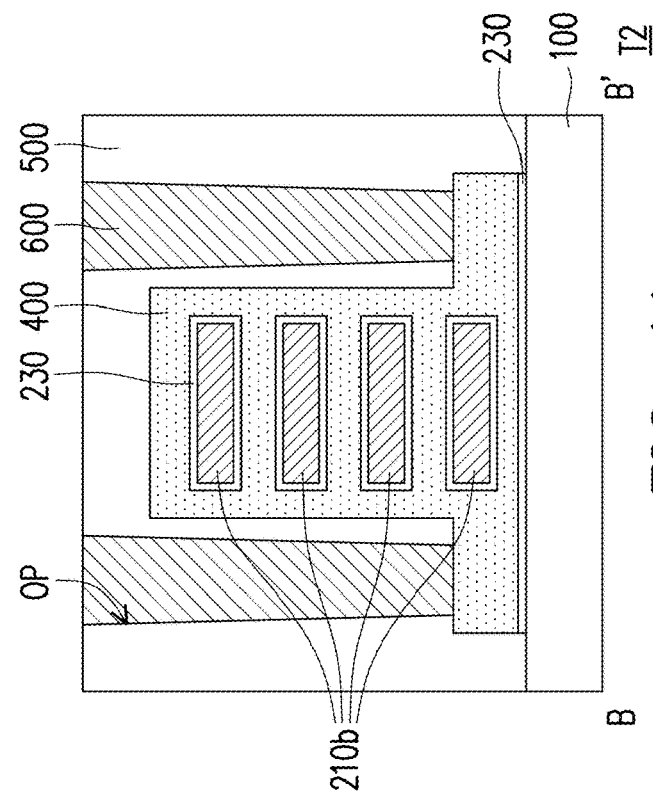
Figure 3J:
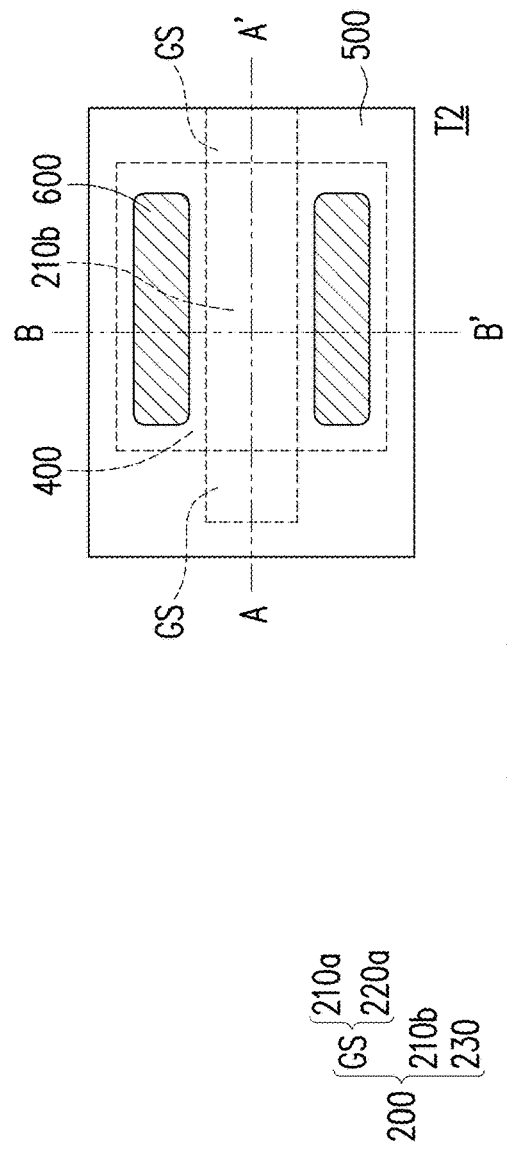

Referring to FIG. 5A, FIG. 5B, and FIG. 5C, the second transistor T2A in FIG. 5A, FIG. 5B, and FIG. 5C is similar to the second transistor T2 in FIG. 2J, FIG. 3J, and FIG. 4J, so similar elements are denoted by the same reference numerals and the detailed descriptions thereof are omitted herein. The difference between the second transistor T2A of FIG. 5A, FIG. 5B, and FIG. 5C and the second transistor T2 of FIG. 2J, FIG. 3J, and FIG. 4J lies in that the nanosheet 210b in the second transistor T2A of FIG. 5A, FIG. 5B, and FIG. 5C are elliptical in the cross-sectional view. For example, when the etching selectivity of the first material layer 210 with respect to the second material layer 220 (shown in FIG. 3C to FIG. 3D and FIG. 4C to FIG. 4D) is not high enough, the first material layer 210 may be slightly removed during removal of the second material layer 220, thereby rendering nanosheets 210b with rounded corners. In some embodiments, the second transistor T2A in FIG. 5A, FIG. 5B, and FIG. 5C may be utilized as the second transistor T2 in FIG. 1.

In some embodiments, by allowing the gate structure 200 to include elliptical nanosheets 210b, the contact area between the channel layer 400 and the gate structure 200 (i.e. the elliptical nanosheets 210b) may be sufficiently increased. In other words, the effective width of the second transistor T2A may be effectively increased to render improved electrical performance.

FIG. 6A is a top view of a second transistor T2B in accordance with some alternative embodiments of the disclosure. FIG. 6B and FIG. 6C are cross-sectional views of the second transistor T2B in FIG. 6A. It should be noted that the cross-sectional view of FIG. 6B is taken along cross-sectional line A-A' in FIG. 6A and the cross-sectional view of FIG. 6C is taken along cross-sectional line B-B' in FIG. 6A.

Referring to FIG. 6A, FIG. 6B, and FIG. 6C, the second transistor T2B in FIG. 6A, FIG. 6B, and FIG. 6C is similar to the second transistor T2 in FIG. 2J, FIG. 3J, and FIG. 4J, so similar elements are denoted by the same reference numerals and the detailed descriptions thereof are omitted herein. The difference between the second transistor T2B of FIG. 6A, FIG. 6B, and FIG. 6C and the second transistor T2 of FIG. 2J, FIG. 3J, and FIG. 4J lies in that the nanosheet 210b in the second transistor T2B of FIG. 6A, FIG. 6B, and FIG. 6C are circular in the cross-sectional view. For example, when the etching selectivity of the first material layer 210 with respect to the second material layer 220 (shown in FIG. 3C to FIG. 3D and FIG. 4C to FIG. 4D) is low, a significant amount of the first material layer 210 may be removed during removal of the second material layer 220, thereby rendering circular nanosheets 210b. In some embodiments, the second transistor T2B in FIG. 6A, FIG. 6B, and FIG. 6C may be utilized as the second transistor T2 in FIG. 1.

In some embodiments, by allowing the gate structure 200 to include circular nanosheets 210b, the contact area between the channel layer 400 and the gate structure 200 (i.e. the circular nanosheets 210b) may be sufficiently increased. In other words, the effective width of the second transistor T2A may be effectively increased to render improved electrical performance.

FIG. 7A to FIG. 7D are top views illustrating various stages of a manufacturing method of a second transistor T2C in accordance with some alternative embodiments of the disclosure. FIG. 8A to FIG. 8D and FIG. 9A to FIG. 9D are cross-sectional views illustrating various stages of the manufacturing method of the second transistor T2C in FIG. 7A to FIG. 7D. It should be noted that the cross-sectional views of FIG. 8A to FIG. 8D are taken along cross-sectional line A-A' in FIG. 7A to FIG. 7D and the cross-sectional views of FIG. 9A to FIG. 9D are taken along cross sectional line B-B' in FIG. 7A to FIG. 7D.

Figure 7A:
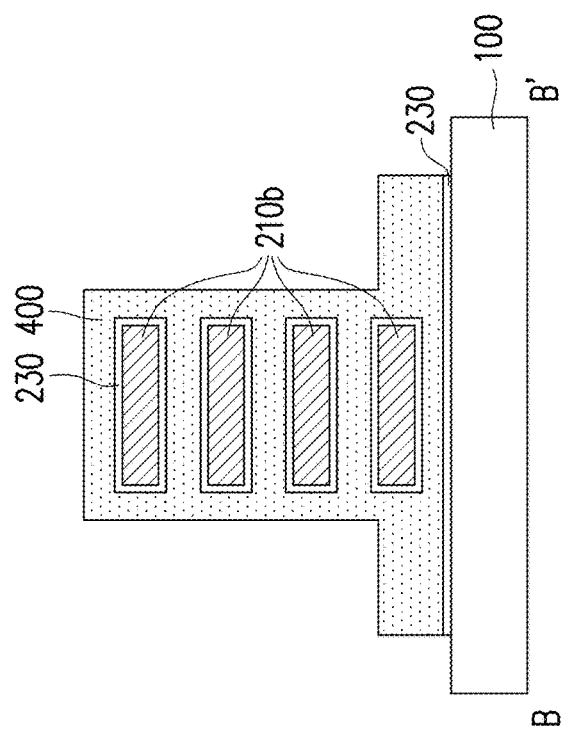
Figure 8A:
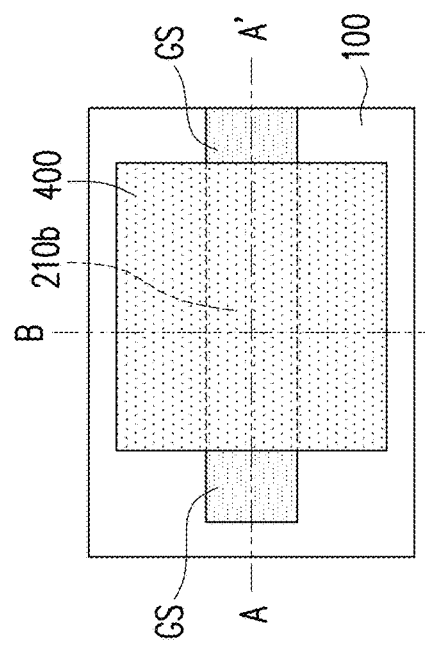
Figure 9A:
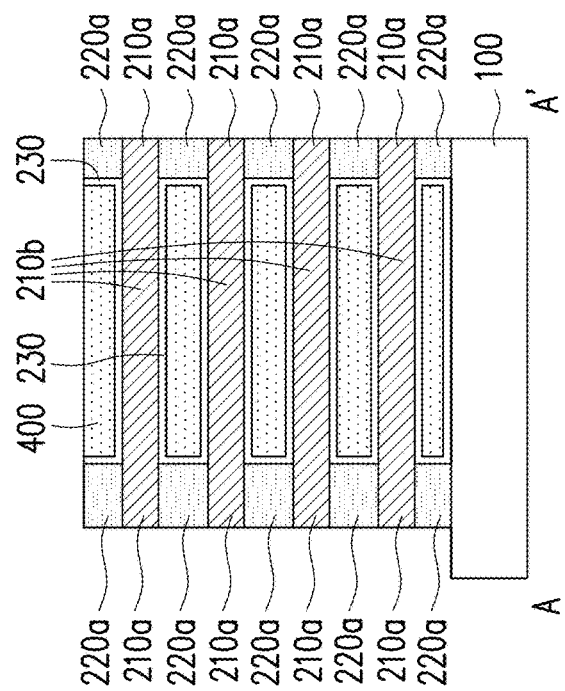
Figure 7B:
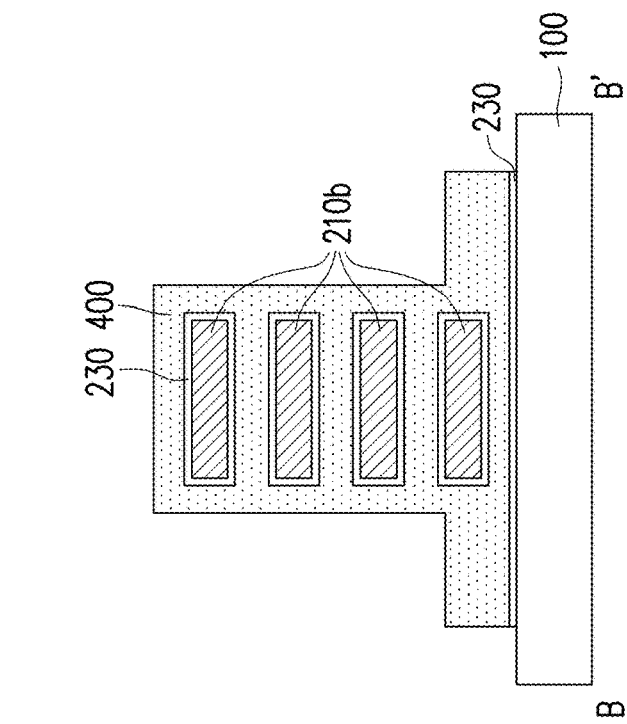
Figure 9B:
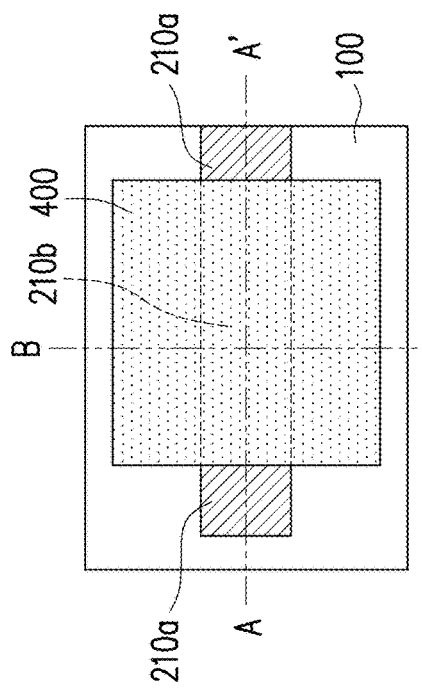

Referring to FIG. 7A, FIG. 8A, and FIG. 9A, the structures illustrated in FIG. 7A, FIG. 8A, and FIG. 9A are similar to the structures illustrated in FIG. 2G, FIG. 3G, and FIG. 4G, so similar elements are denoted by the same reference numerals and the detailed descriptions thereof are omitted herein. In other words, the structures illustrated in FIG. 7A, FIG. 8A, and FIG. 9A may be obtained by performing the steps illustrated in FIG. 2A to FIG. 2G, FIG. 3A to FIG. 3G, and FIG. 4A to FIG. 4G. As illustrated in FIG. 8A, the top surface of the channel layer 400, the top surface of the gate dielectric layer 230, and the top surfaces of the stacking structures GS are substantially coplanar with one another.

Figure 8B:
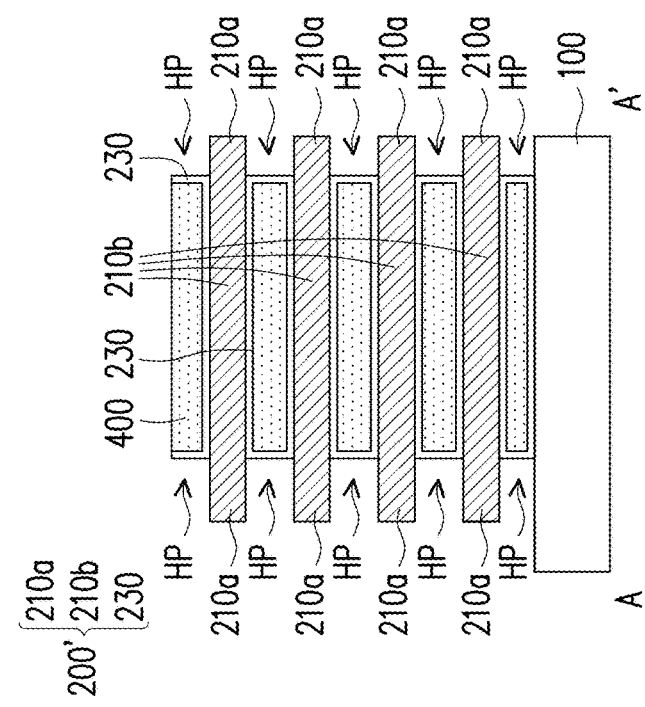

Referring to FIG. 7A to FIG. 7B, FIG. 8A to FIG. 8B, and FIG. 9A to FIG. 9B, after the channel layer 400 is formed over the nanosheets 210b, the second material layers 220a in the stacking structures GS are removed to form hollow portions HP. For example, the second material layers 220a in the stacking structures GS are removed to expose the first material layers 210a and the gate dielectric layer 230. That is, the second material layers 220a protrude from sidewalls of the gate dielectric layer 230. In some embodiments, the second material layers 220a are removed through an etching process. The etching process includes, for example, an anisotropic etching process such as dry etch or an isotropic etching process such as wet etch. In some embodiments, an etchant for the wet etch includes a combination of hydrogen fluoride (HF) and ammonia ($NH_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. In some embodiments, after the removal of the second material layers 220a in the stacking structures GS, a gate structure 200' is formed. As illustrated in FIG. 8B, the gate structure 200' includes the first material layers 210a, the nanosheets 210b, and the gate dielectric layer 230. In some embodiments, the gate dielectric layer 230 and the channel layer 400 wrap around the nanosheets 210b while the first material layers 210a are disposed on opposite sides of the channel layer 400. In some embodiments, the first material layers 210a and the nanosheets 210b are collectively referred to as a gate electrode of the gate structure 200'.

Figure 7C:
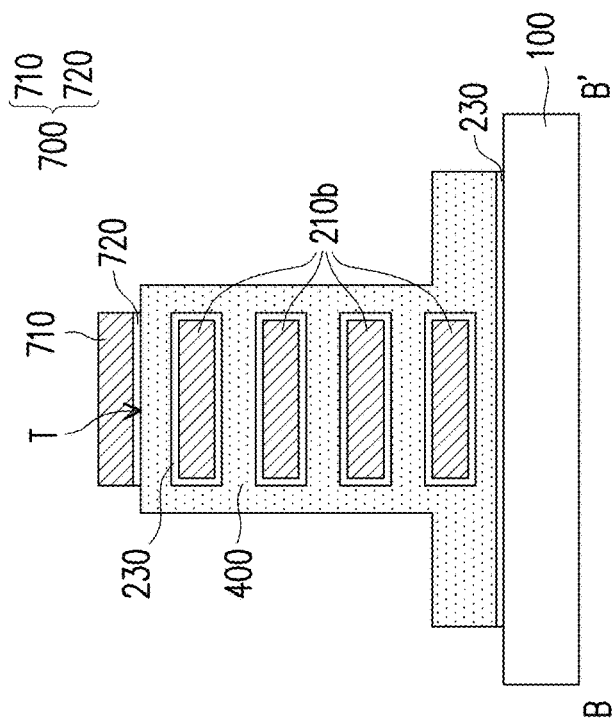
Figure 9C:
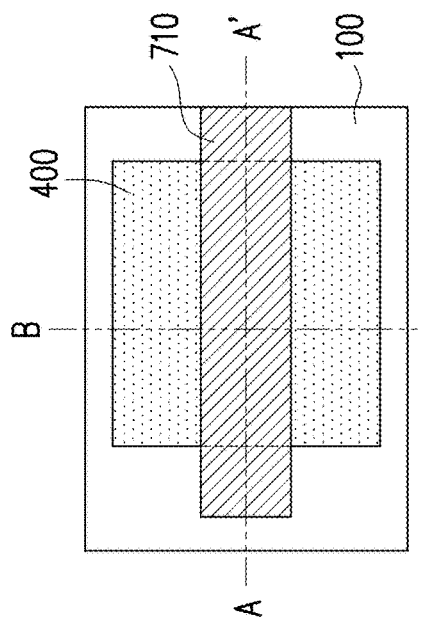
Figure 8C:
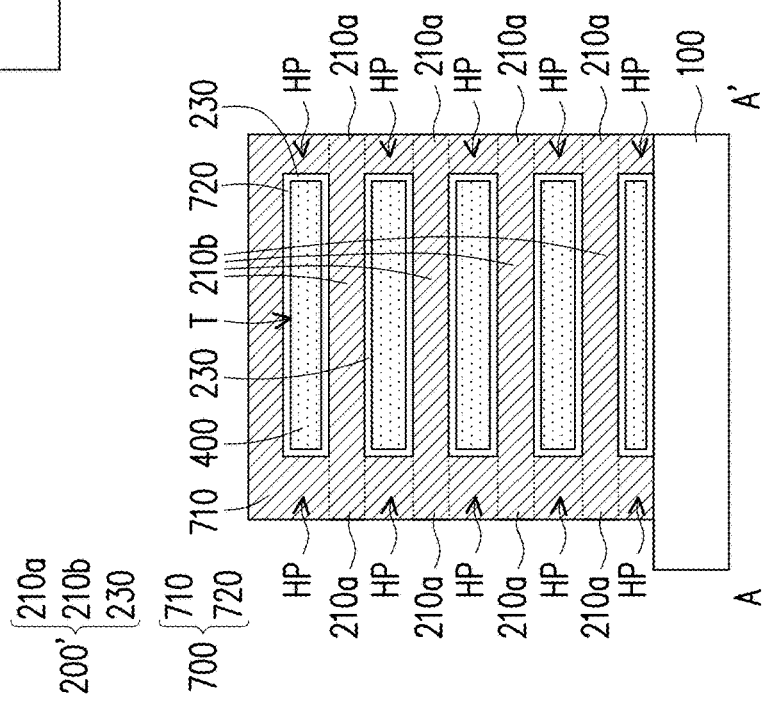

Referring to FIG. 7C, FIG. 8C, and FIG. 9C, a gate structure 700 is formed over the first material layers 210a in the stacking structures GS (i.e. the protruding first material layers 210a), the gate dielectric layer 230, and the channel layer 400. In some embodiments, the gate structure 700 includes a gate electrode 710 and a gate dielectric layer 720. As illustrated in FIG. 9C, the gate dielectric layer 720 and the gate electrode 710 are sequentially deposited over a portion of a top surface T of the channel layer 400. That is, the gate structure 700 covers a portion of the top surface T of the channel layer 400. In some embodiments, the gate dielectric layer 720 is sandwiched between the channel layer 400 and the gate electrode 710. In some embodiments, the gate electrode 710 also fills the hollow portion HP. In some embodiments, the gate electrode 710 is made of a conductive material. For example, the gate electrode 710 may be made of copper, titanium, tantalum, tungsten, aluminum, zirconium, hafnium, cobalt, titanium aluminum, tantalum aluminum, tungsten aluminum, zirconium aluminum, hafnium aluminum, any other suitable metal-containing material, or a combination thereof. In some embodiments, the gate electrode 710 also include materials to fine-tune the corresponding work function. For example, the gate electrode 710 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof. In some embodiments, the gate electrode 710 is deposited through ALD, CVD, PVD, or the like.

In some embodiments, a material and a formation method of the gate dielectric layer 720 is similar to that of the gate dielectric layer 230 in FIG. 2E, FIG. 3E, and FIG. 4E, so the detailed descriptions thereof are omitted herein. In some embodiments, a barrier layer (not shown) is optionally formed between the gate electrode 710 and the gate dielectric layer 720, so as to avoid diffusion of atoms between elements. In some embodiments, materials of the barrier layer includes TiN, TaN, TiSiN, TaSiN, WSiN, TIC, TaC, TiAlC, TaAlC, TiAlN, TaAlN, or a combination thereof.

It should be noted that although FIG. 7A to FIG. 7C, FIG. 8A to FIG. 8C, and FIG. 9A to FIG. 9C illustrated the removal of the second material layer 220a prior to the formation of the gate structure 700, the removal of the second material layer 220a may be optional. In other words, in some alternative embodiments, the gate structure 700 is formed on the second material layer 220a, the gate dielectric layer 230, and the channel layer 400 without removing the second material layer 220a in the stacking structures GS.

Referring to FIG. 7C to FIG. 7D, FIG. 8C to FIG. 8D, and FIG. 9C to FIG. 9D, steps similar to that of FIG. 2H to FIG. 2J, FIG. 3H to FIG. 3J, and FIG. 4H to FIG. 4J are performed to obtain the second transistor T2C. As illustrated in FIG. 7D, FIG. 8D, and FIG. 9D, the second transistor T2C in FIG. 7D, FIG. 8D, and FIG. 9D is similar to the second transistor T2 in FIG. 2J, FIG. 3J, and FIG. 4J, so similar elements are denoted by the same reference numerals and the detailed descriptions thereof are omitted herein. The difference between the second transistor T2C of FIG. 7D, FIG. 8D, and FIG. 9D and the second transistor T2 of FIG. 2J, FIG. 3J, and FIG. 4J lies in that the second transistor T2C of FIG. 7D, FIG. 8D, and FIG. 9D further includes the gate structure 700 over the channel layer 400. In some embodiments, the gate structure 700 partially covers the channel layer 400. In some embodiments, the gate structure 700 is located between the source/drain contacts 600. In some embodiments, a width and a length of the gate structure 700 are substantially equal to a width and a length of the gate structure 200'. However, the disclosure is not limited thereto. In some alternative embodiments, the width and/or the length of the gate structure 700 may be smaller than or greater than the width/and or the length of the gate structure 200'. In some embodiments, the second transistor T2C may be referred to as a double gate transistor or a dual gate transistor. In some embodiments, the second transistor T2C in FIG. 7D, FIG. 8D, and FIG. 9D may be utilized as the second transistor T2 in FIG. 1.

FIG. 10A is a top view of a second transistor T2D in accordance with some alternative embodiments of the disclosure. FIG. 10B and FIG. 10C are cross-sectional views of the second transistor T2D in FIG. 10A. It should be noted that the cross-sectional view of FIG. 10B is taken along cross-sectional line A-A' in FIG. 10A and the cross-sectional view of FIG. 10C is taken along cross-sectional line B-B' in FIG. 10A.

Referring to FIG. 10A, FIG. 10B, and FIG. 10C, the second transistor T2D in FIG. 10A, FIG. 10B, and FIG. 10C is similar to the second transistor T2C in FIG. 7D, FIG. 8D, and FIG. 9D, so similar elements are denoted by the same reference numerals and the detailed descriptions thereof are omitted herein. The difference between the second transistor T2D of FIG. 10A, FIG. 10B, and FIG. 10C and the second transistor T2C of FIG. 7D, FIG. 8D, and FIG. 9D lies in that in the second transistor T2D of FIG. 10A, FIG. 10B, and FIG. 10C, the gate structure 700 further covers a portion of sidewalls SW of the channel layer 400. For example, the gate electrode 710 and the gate dielectric layer 720 extend from the top surface T of the channel layer 400 to the sidewalls SW of the channel layer 400. In some embodiments, the gate dielectric layer 720 is sandwiched between the channel layer 400 and the gate electrode 710. In some embodiments, the gate electrode 710 and the gate dielectric layer 720 respectively resemble a reversed U shape in the cross-sectional view of FIG. 10C. In some embodiments, the gate structure 700 is located between the source/drain contacts 600. In some embodiments, a length of the gate structure 700 is substantially equal to a length of the gate structure 200'. However, the disclosure is not limited thereto. In some alternative embodiments, the length of the gate structure 700 may be smaller than or greater than the length of the gate structure 200'. In some embodiments, a width of the gate structure 700 is greater than a width of the gate structure 200'. In some embodiments, the second transistor T2D may be referred to as a double gate transistor or a dual gate transistor. In some embodiments, the second transistor T2D in FIG. 10A, FIG. 10B, and FIG. 10C may be utilized as the second transistor T2 in FIG. 1.

FIG. 11A is a top view of a second transistor T2E in accordance with some alternative embodiments of the disclosure. FIG. 11B and FIG. 11C are cross-sectional views of the second transistor T2E in FIG. 11A. It should be noted that the cross-sectional view of FIG. 11B is taken along cross-sectional line A-A' in FIG. 11A and the cross-sectional view of FIG. 11C is taken along cross-sectional line B-B' in FIG. 11A.

Referring to FIG. 11A, FIG. 11B, and FIG. 11C, the second transistor T2E in FIG. 11A, FIG. 11B, and FIG. 11C is similar to the second transistor T2 in FIG. 2J, FIG. 3J, and FIG. 4J, so similar elements are denoted by the same reference numerals and the detailed descriptions thereof are omitted herein. The difference between the second transistor T2E of FIG. 11A, FIG. 11B, and FIG. 11C and the second transistor T2 of FIG. 2J, FIG. 3J, and FIG. 4J lies in that the second transistor T2E of FIG. 11A, FIG. 11B, and FIG. 11C further includes a capping layer 800. In some embodiments, the capping layer 800 is disposed on the channel layer 400 to protect the channel layer 400 from hydrogen atoms, which is known to damage the channel layer 400, generated during the manufacturing process of the transistor. In some embodiments, a material of the capping layer 800 includes $Al_2O_3$, ZrNi, or the like. In some embodiments, the capping layer 800 is conformally deposited on the top surface of the channel layer 400 through ALD, CVD, PVD, or the like. As illustrated in FIG. 11C, at least a portion of the capping layer 800 is sandwiched between the channel layer 400 and the source/drain contacts 600. In some embodiments, the electrical connection between the channel layer 400 and the source/drain contacts 600 is achieved by ohmic contact. In some embodiments, the second transistor T2E in FIG. 11A, FIG. 11B, and FIG. 11C may be utilized as the second transistor T2 in FIG. 1.

In accordance with some embodiments of the disclosure, a transistor includes a first gate structure, a channel layer, and source/drain contacts. The first gate structure includes nanosheets. The channel layer is over the first gate structure. A portion of the channel layer wraps around the nanosheets of the first gate structure. The source/drain contacts are aside the nanosheets. The source/drain contacts are electrically connected to the channel layer.

In accordance with some embodiments of the disclosure, an integrated circuit includes a substrate and an interconnection structure. The substrate has a first transistor embedded therein. The interconnection structure is disposed on the substrate and includes dielectric layers, a memory cell embedded in the dielectric layers, and a second transistor electrically connected to the memory cell and embedded in the dielectric layers. The second transistor includes a channel layer, a first gate structure, and source/drain contacts. The first gate structure includes nanosheets. The nanosheets penetrate through the channel layer. The source/drain contacts are aside the nanosheets. The source/drain contacts are electrically connected to the channel layer.

In accordance with some embodiments of the disclosure, a manufacturing method of a transistor includes at least the following steps. A dielectric layer is provided. A stack is formed on the dielectric layer. The stack includes first material layers and second material layers alternately stacked on one another. The stack is patterned to form stacking structures and nanosheets connecting the stacking structures. A gate dielectric layer is formed over the nanosheets and the stacking structures. A channel layer is formed over the nanosheets. The channel layer wraps around the nanosheets and the gate dielectric layer disposed on the nanosheets. Source/drain contacts are formed aside the nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
a first gate structure comprising metallic nanosheets, wherein each of the metallic nanosheets comprises a top surface, a bottom surface opposite to the top surface, and sidewalls connecting the top surface and the bottom surface;
a channel layer surrounding the top surfaces, the bottom surfaces, and the sidewalls of the metallic nanosheets; and
source/drain contacts electrically connected to the channel layer, wherein a portion of the channel layer is located between the source/drain contacts and the metallic nanosheets.

2. The transistor of claim 1, wherein the metallic nanosheets are rectangular nanosheets in a cross-sectional view.

3. The transistor of claim 1, further comprising a second gate structure disposed on the channel layer.

4. The transistor of claim 3, wherein the second gate structure covers a portion of a top surface of the channel layer.

5. The transistor of claim 4, wherein the second gate structure further covers a portion of sidewalls of the channel layer.

6. The transistor of claim 1, further comprising a capping layer over the channel layer, wherein at least a portion of the capping layer is sandwiched between the channel layer and the source/drain contacts.

7. The transistor of claim 1, wherein the first gate structure further comprises:
a gate dielectric layer sandwiched between the metallic nanosheets and the channel layer, wherein the gate dielectric layer is in physical contact with the top surfaces, the bottom surfaces, and the sidewalls of the metallic nanosheets; and
stacking structures located at two opposite ends of each of the metallic nanosheets.

8. The transistor of claim 7, wherein each stacking structure comprises a laminate structure of first material layers and second material layers alternately stacked on one another.

9. The transistor of claim 8, wherein a material of the first material layers and a material of the metallic nanosheets are the same.

10. An integrated circuit, comprising:
a substrate; and
an interconnection structure disposed on the substrate, comprising:
dielectric layers; and
a transistor embedded in the dielectric layers, comprising:
a channel layer;
a first gate structure comprising metallic nanosheets, wherein the channel layer surrounds the metallic nanosheets; and
source/drain contacts electrically connected to the channel layer, wherein a portion of the channel layer is located between the source/drain contacts and the metallic nanosheets.

11. The integrated circuit of claim 10, wherein the first gate structure further comprises:
a gate dielectric layer sandwiched between the metallic nanosheets and the channel layer; and
stacking structures disposed on opposite sides of the channel layer, wherein the metallic nanosheets connect the stacking structures.

12. The integrated circuit of claim 10, wherein the metallic nanosheets are rectangular nanosheets, circular nanosheets, or elliptical nanosheets in a cross-sectional view.

13. The integrated circuit of claim 10, wherein the transistor further comprises a second gate structure covering a portion of a top surface of the channel layer.

14. The integrated circuit of claim 13, wherein the second gate structure further covers a portion of sidewalls of the channel layer.

15. The integrated circuit of claim 10, wherein the transistor further comprises a capping layer over the channel layer, and at least a portion of the capping layer is sandwiched between the channel layer and the source/drain contacts.

16. A manufacturing method of a transistor, comprising:
alternately depositing first material layers and second material layers to form a stack;
removing a portion of each of the second material layers in the stack to form metallic nanosheets and stacking structures connected by the metallic nanosheets;
forming a channel layer to surround the metallic nanosheets; and
forming source/drain contacts, wherein a portion of the channel layer is located between the source/drain contacts and the metallic nanosheets.

17. The method of claim 16, wherein removing the portion of each of the second material layers in the stack comprises:
forming a patterned mask layer over the stack, wherein the patterned mask layer exposes the portion of each of the second material layers; and
removing the portion of each of the second material layers exposed by the patterned mask layer through an etching process.

18. The method of claim 16, further comprising:
forming an interlayer dielectric layer over the stacking structures and the channel layer;
forming contact openings in the interlayer dielectric layer to partially expose the channel layer; and
filling a conductive material into the contact openings of the interlayer dielectric layer to form the source/drain contacts.

19. The method of claim 16, further comprising:
after forming the channel layer over the metallic nanosheets, removing the second material layers in the stacking structures; and
forming a gate structure over the first material layers in the stacking structures and over the channel layer.

20. The method of claim 16, further comprising:
forming a capping layer over the channel layer.

* * * * *